(12) United States Patent
Fujimoto

(10) Patent No.: US 7,791,133 B2
(45) Date of Patent: Sep. 7, 2010

(54) SEMICONDUCTOR DEVICE WITH REDUCED GATE-OVERLAP CAPACITANCE AND METHOD OF FORMING THE SAME

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/235,663

(22) Filed: Sep. 23, 2008

(65) Prior Publication Data

US 2009/0078993 A1 Mar. 26, 2009

(30) Foreign Application Priority Data

Sep. 25, 2007 (JP) ............................. 2007-247219

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................ 257/329; 257/328; 257/E21.141; 257/E21.413; 257/E21.13; 257/E29.131; 257/E47.001

(58) Field of Classification Search ................ 257/328, 257/329, E21.41, E21.413, E29.13, E29.131, 257/E47.001; 438/268
See application file for complete search history.

(56) References Cited

U.S. PATENT DOCUMENTS

2004/0089893 A1* 5/2004 Bissey et al. ................. 257/302
2006/0131636 A1* 6/2006 Jeon et al. .................... 257/315

FOREIGN PATENT DOCUMENTS

| JP | 09-008290 | 1/1997 |
| JP | 09-008295 | 1/1997 |
| JP | 2004-221242 | 8/2004 |

\* cited by examiner

*Primary Examiner*—David S Blum
(74) *Attorney, Agent, or Firm*—Young & Thompson

(57) ABSTRACT

A semiconductor device includes a vertically extending semiconductor portion above a semiconductor substrate, first and second diffusion regions being disposed near the bottom and top portions of the vertically extending semiconductor portion, respectively. A gate insulating film extends along the side surface of the vertically extending semiconductor portion which is separated by the gate insulating film from a gate electrode. The level of the top portion of the gate electrode is nearly equal to or lower than the level of the bottom portion of the second diffusion regions and the level of the bottom portion of the gate electrode is nearly equal to or higher than the level of the top portion of the first diffusion region.

20 Claims, 16 Drawing Sheets

SEMICONDUCTOR DEVICE WITH REDUCED GATE-OVERLAP CAPACITANCE AND METHOD OF FORMING THE SAME

BACKGROUND OF THE INVENTION

1. Field of the Invention

The present invention generally relates to a semiconductor device and a method of forming the same. More specifically, the present invention relates to a semiconductor device with gate-overlap capacitance and a method of forming the same.

Priority is claimed on Japanese Patent Application No. 2007-247219 filed Sep. 25, 2007, the content of which is incorporated herein by reference.

2. Description of the Related Art

In recent years, there has been progressed high density integration and shrinkage of a semiconductor device with various techniques.

Japanese Unexamined Patent Application, First Publication, No. 9-8290 discloses a vertical MOS transistor that includes a semiconductor pillar that extends vertically from a main surface of a semiconductor substrate. The pillar is covered by a gate insulating film. A gate electrode is provided on the gate insulating film so that the gate electrode is separated by the gate insulating film from the gate electrode.

Japanese Unexamined Patent Application, First Publication, No. 9-8295 discloses a semiconductor device that includes a semiconductor pillar extending from a semiconductor substrate. A drain is selectively formed in a portion of the semiconductor pillar. A source is formed on the surface of the semiconductor substrate. A gate insulating film extends along the side surface of the pillar. A gate electrode is provided on the gate insulating film so that the gate electrode surrounds the pillar. A photon-shielding material is provided which covers the gate electrode.

Japanese Unexamined Patent Application, First Publication, No. 2004-221242 discloses a semiconductor integrated circuit including a vertical MISFET that includes a multi-layered pillar structure having upper and lower semiconductor layers. An insulating film extends along the side surface of multi-layered pillar structure. A conductive film extends along the insulating film so that the conductive film and the insulating film surround the side surface of multi-layered pillar structure.

SUMMARY

In one embodiment, a, semiconductor device may include, but is not limited to, a semiconductor substrate, and the following elements. A vertically extending portion of semiconductor may be disposed above the semiconductor substrate. The vertically extending portion of semiconductor has top and bottom portions and a side surface. A first diffusion region may be disposed near the bottom portion of the vertically extending portion of semiconductor. A second diffusion region may be disposed near the top portion of the vertically extending portion of semiconductor. A gate insulating film may extend along the side surface of the vertically extending portion of semiconductor. A gate electrode may be disposed on the gate insulating film. The gate electrode is separated by the gate insulating film from the vertically extending portion of semiconductor. The gate electrode has top and bottom portions. The level of the top portion of the gate electrode may be nearly equal to or lower than the level of the bottom portion of the second diffusion region, and the level of the bottom portion of the gate electrode may be nearly equal to or higher than the level of the top portion of the first diffusion region, thereby reducing gate-overlap capacitance.

In another embodiment, a semiconductor device may include, but is not limited to, a semiconductor substrate, and the following elements. A vertically extending portion of semiconductor may be disposed above the semiconductor substrate. The vertically extending portion of semiconductor has top and bottom portions and a side surface. A first diffusion region may be disposed near the bottom portion of the vertically extending portion of semiconductor. A second diffusion region may be disposed near the top portion of the vertically extending portion of semiconductor. A gate insulating film may extend along the side surface of the vertically extending portion of semiconductor. A gate electrode may be disposed on the gate insulating film. The gate electrode is separated by the gate insulating film from the vertically extending portion of semiconductor. The gate electrode horizontally overlaps at least a part of the vertically extending portion of semiconductor without horizontally overlapping the first and second diffusion regions, thereby reducing gate-overlap capacitance.

In still another embodiment, a semiconductor device may include, but is not limited to, a semiconductor substrate, and the following elements. A pillar of semiconductor may extend from the semiconductor substrate generally in a vertical direction to the surface of the semiconductor substrate. The pillar of semiconductor has top and bottom portions and a side surface. A first diffusion region may be disposed around the bottom portion of the pillar of semiconductor. A second diffusion region may be disposed over the top portion of he pillar of semiconductor. A gate insulating film may extend along the side surface of the pillar of semiconductor. A gate electrode may be disposed on the gate insulating film. The gate electrode is separated by the gate insulating film from the pillar of semiconductor. The gate electrode horizontally overlaps at least a part of the pillar of semiconductor without horizontally overlapping the first and second diffusion regions, thereby reducing gate-overlap capacitance.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, some embodiments of the related art will be described in detail with reference to FIGS. 9A through 9I, in order to facilitate the understanding of the present invention.

Figure 9A:
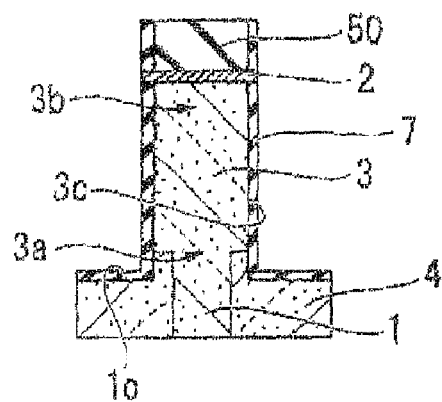
FIGS. 9A through 9I are fragmentary cross sectional elevation views illustrating sequential steps involved in a method of forming the semiconductor device in accordance with the related art.

With reference to FIG. 9A, a semiconductor substrate 1 is prepared which is made of silicon. A silicon oxide film 2 is formed on the surface of the semiconductor substrate 1. A silicon nitride film is formed on the silicon oxide film 2. A resist film is applied on the silicon nitride film. A lithography process is carried out to pattern the resist film, thereby forming a resist pattern over the silicon nitride film. An etching process is carried out using the resist pattern as a mask to pattern the silicon nitride film, thereby forming a silicon nitride mask layer 50. The resist pattern is removed. An anisotropic etching process is carried out using the silicon nitride mask layer 50 as a mask to selectively etch the silicon oxide film 2 and the semiconductor substrate 1, thereby forming a silicon pillar 3. The pillar 3 extends vertically from the surface 1c of the semiconductor substrate 1. The pillar 3 has a base portion 3a and a top portion 3b. The pillar 3 has a side surface 3c.

A dopant is selectively introduced into the semiconductor substrate 1 around the base portion 3a of the pillar 3, thereby forming a first diffusion region 4 in the semiconductor substrate 1. An oxidation process is carried out to oxidize the side surface 3c of the pillar 3 and the surface of the semiconductor substrate 1, thereby forming a gate insulating film 7. The gate insulating film 7 extends along the side surface 3c of the pillar 3 and the surface of we semiconductor substrate 1 as well as over the silicon nitride mask layer 50.

Figure 9B:
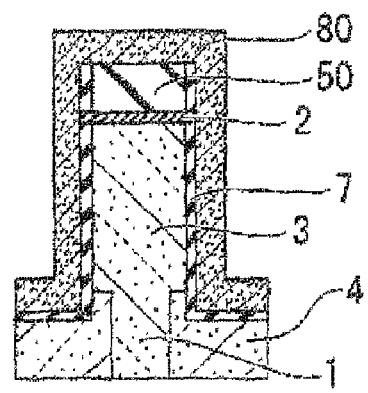

With reference to FIG. 9B, a chemical vapor deposition process is carried out, thereby forming a gate electrode layer 80 which covers the pillar 3 and the semiconductor substrate 1. The gate electrode layer 80 can be realized by, but is not limited to, a doped polysilicon film.

Figure 9C:
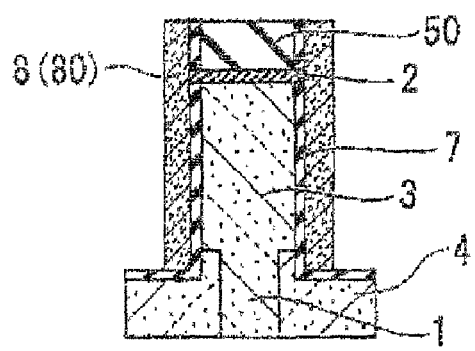

With reference to FIG. 9C, an etch-back process is carried out to etch the gate electrode layer 80 back in the direction vertical to the surface 1c of the semiconductor substrate 1, so that the silicon nitride mask layer 50 is exposed, resulting in that a gate electrode 8 is formed. The gate electrode 8 extends along the side surface of the pillar 3 and surrounds the pillar 3.

Figure 9D:
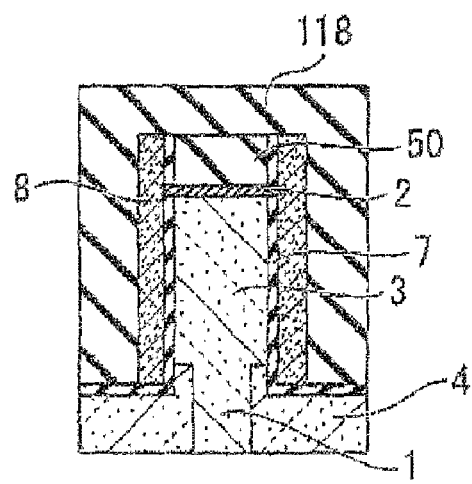

With reference to FIG. 9D, a first interlayer insulator 118 is formed which covers the semiconductor substrate 1 and the pillar 3.

Figure 9E:
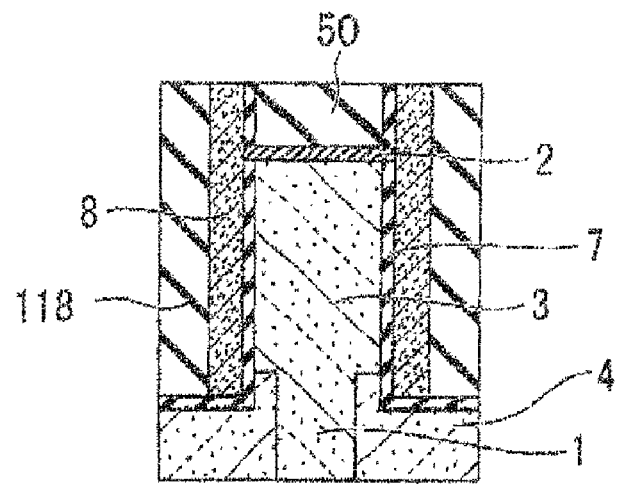

With reference to FIG. 9E, a chemical mechanical polishing process is carried out to polish the first inter-layer insulator 118, so that the silicon nitride mask layer 50 and the top of the gate electrode 8 are exposed. The first inter-layer insulator 118 surrounds the gate electrode 8.

Figure 9F:
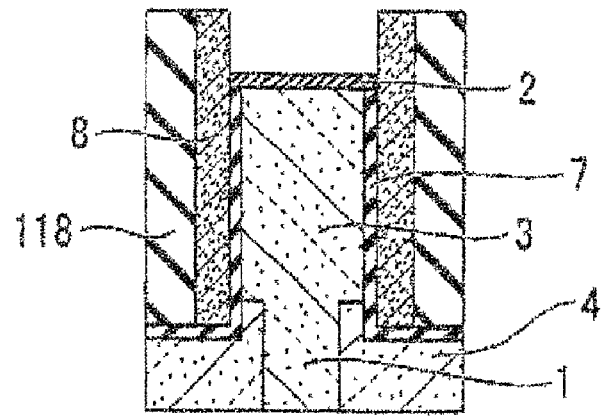

With reference to FIG. 9F, a wet etching process is carried out to remove the silicon nitride mask layer 50, so that the silicon oxide film 2 is exposed.

Figure 9G:
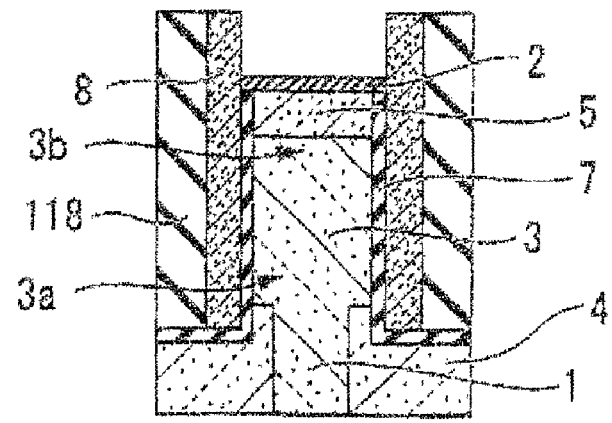

With reference to FIG. 9G, a dopant is introduced into the top portion 3b of the pillar 3 through the silicon oxide film 2, thereby forming a second diffusion region 5 in the upper region of the pillar 3. The upper portion 3b of the pillar 3 is adjacent to the second diffusion region 5.

Figure 9H:
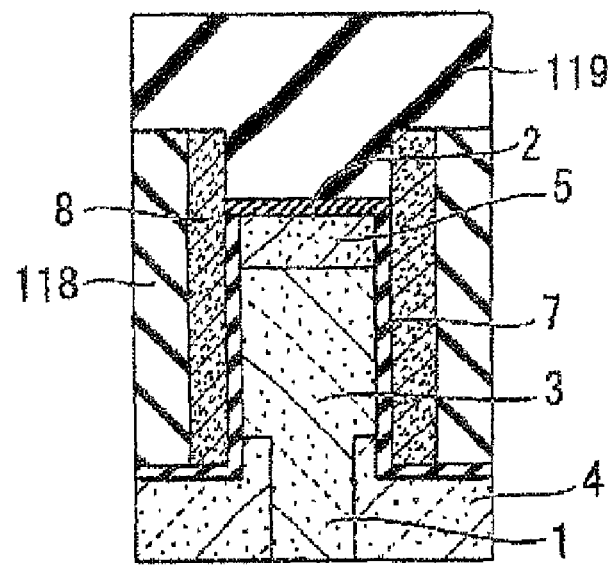

With reference to FIG. 9H, a second inter-layer insulator 119 is formed which covers the silicon oxide film 2, the top of the gate electrode 8, and the top of the first inter-layer insulator 118.

Figure 9I:
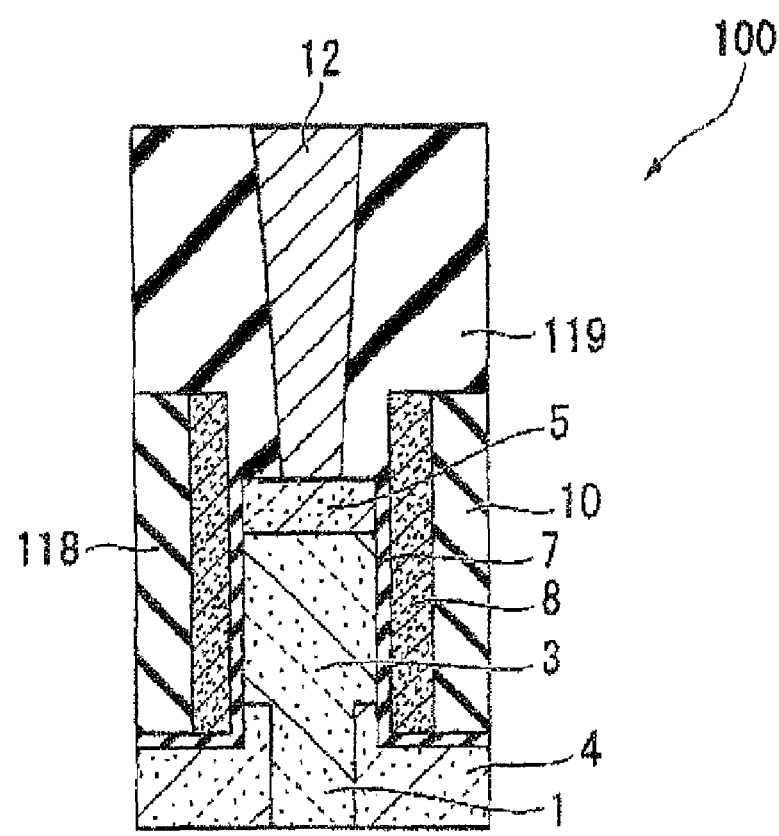

With reference to FIG. 9I, a contact hole is formed in the second inter-layer insulator 119, so that the contact hole reaches the second diffusion region 5. A contact plug 12 is formed in the contact hole so that the contact plug 12 is connected to the second diffusion region 5, thereby forming a vertical MOS transistor 100.

The gate electrode 8 partially overlaps the first and second diffusion regions 4 and 5, thereby increasing a gate-overlap capacitance. The gate-overlap capacitance is caused by trapping charges between the gate electrode 8 and the first and second diffusion regions 4 and 5. Increased gate-overlap capacitance unstabilizes the voltage-current characteristic of the vertical MOS transistor 100, thereby deteriorating the reliability of the vertical MOS transistor 100.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

Figure 1:
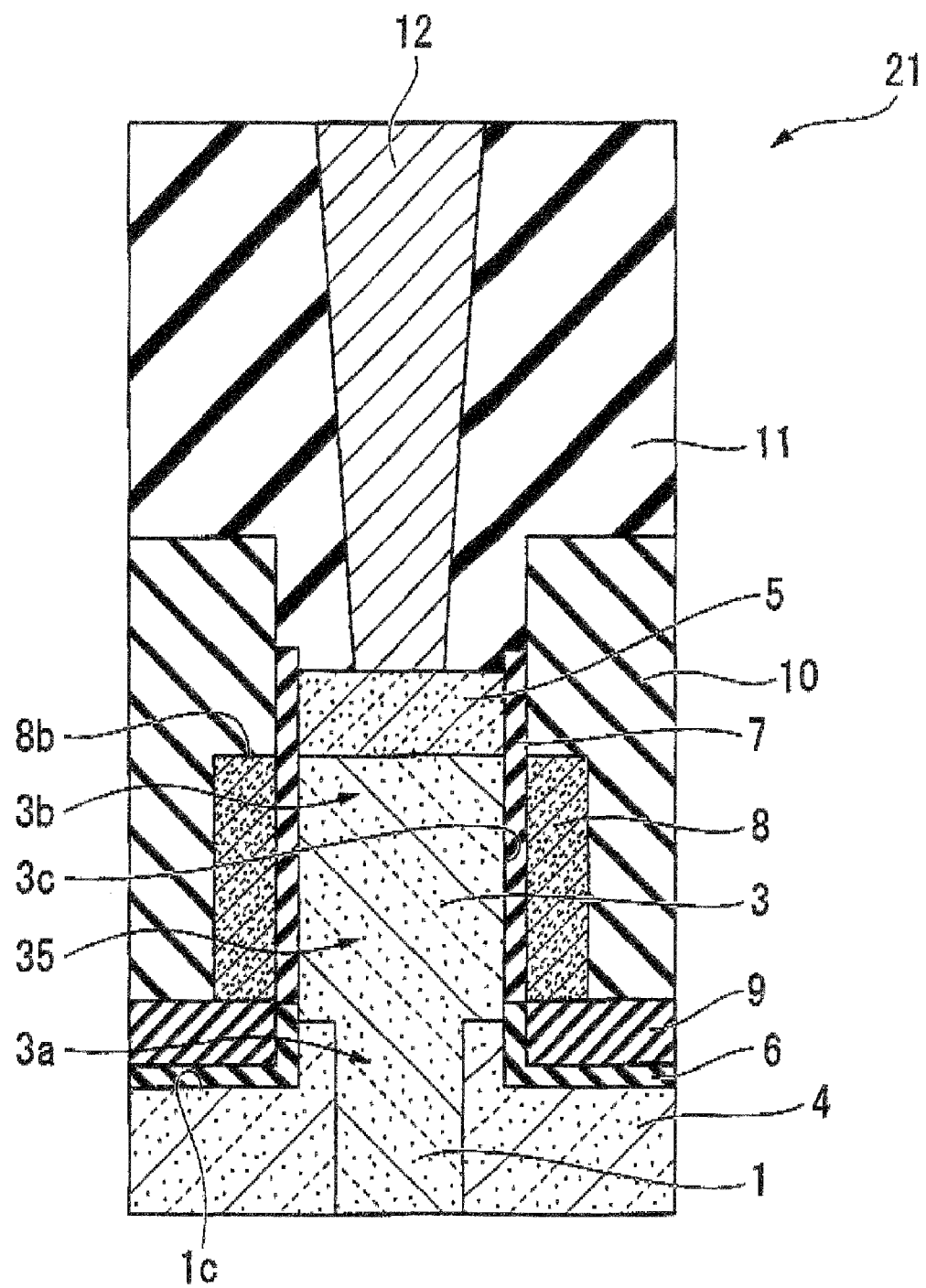
FIG. 1 is a fragmentary cross sectional elevation view illustrating a semiconductor device in accordance with a first preferred embodiment of the present invention.

A semiconductor device 21 will be described in accordance with a first preferred embodiment of the present invention. With reference to FIG. 1, a semiconductor device 21 may include, but is not limited to, the following structural element. The semiconductor device 21 may include a vertically extending portion of semiconductor that is disposed above a semiconductor substrate 1. A typical example of the vertically extending portion of semiconductor may be, but is not limited to, a pillar of semiconductor 3 that extends from a surface 1c of the semiconductor substrate 1 in a vertical direction to the surface 1c of the semiconductor substrate 1. The pillar may include any types of a portion of semiconductor which generally extends in a direction vertical to the surface 1c of a semiconductor substrate 1, but is not limited to the shape thereof as defined in mathematics, so that the semiconductor device 1 may include a channel region which at least partially extends generally in the vertical direction. The pillar 3 has opposing first and second side portions 3a and 3b that are vertically distanced. The first side portion 3a of the pillar 3 is proximal to the semiconductor substrate 1, while the second side portion 3b thereof is distal from the semiconductor substrate 1. The pillar 3 has a side surface 3c. The semiconductor device 21 may also include first and second diffusion regions 4 and 5. The first diffusion region 4 extends in the semiconductor substrate 1, so that the first diffusion region 4 is disposed near or around the first side portion 3a of the pillar 3. The second diffusion region 5 is disposed near or over the second side portion 3b of the pillar 3. The pillar 3 can be regarded as having a body 35 as a part that is positioned in level between the first and second diffusion regions 4 and 5. In an aspect, the pillar 3 may include the body 35. The body 35 of the pillar 3 is defined to be a portion of the pillar 3, which is positioned in level below the second diffusion region 5 and above the first diffusion region 4. The body 35 may partially overlap the first and second side portions 3a and 3b.

The semiconductor device 21 may also include an insulating film 6 that is adjacent to the first diffusion region 4. In some cases, the insulating film 6 can be implemented by a silicon oxide film. The semiconductor device 21 may also include a gate insulating film 7 that extends along the side surface 3c of the pillar 4. The gate insulating film 7 is bounded with the body 35 and the second diffusion region 5. The gate insulating film 7 is not bounded with the first diffusion region 4.

The semiconductor device 21 may also include a gate electrode 8 that is disposed on the gate insulating film 7, so that the gate electrode 8 surrounds the body 35 circumferentially and horizontally without horizontally surrounding the first and second diffusion regions 4 and 5. In general, the gate electrode 8 may horizontally overlap, at least at part of the body 35, but typically may overlap all of the body 35 without horizontally overlapping the first and second diffusion regions 4 and 5. In some cases, the top portion of the gate electrode 8 may have the same level as or a lower level than the bottom of the second diffusion region 5. The bottom portion of the gate electrode 8 may be just or nearly equal in level to or higher in level than the top of the first diffusion region 4. The gate electrode 8 is separated by the gate insulating film 7 from the side surface 3c of the pillar 3. The gate electrode 8 is opposed to the side surface 3c of the pillar 3. The term "opposed to" means that the gate electrode 8 is positioned in the opposite side of the gate insulating film 7 to the side in which the pillar 7 is positioned.

The semiconductor device 21 may also include a first insulating layer 9 that is disposed on the insulating film 6, so that the first insulating layer 9 is separated by the insulating film 6 from the first diffusion region 4. The first insulating layer 9 is positioned under the gate electrode 8. In general, the first insulating layer 9 may horizontally surround the first side portion 3a of the pillar 3.

The semiconductor device 21 may also include a second insulating layer 10 that is positioned over the gate electrode 8 and the first insulating layer 9. The second insulating layer 10 may horizontally surround the gate electrode 8, the gate insulating film 7 and the second diffusion region 5. The gate electrode 8 may be omnidirectionally isolated by the insulating film 6, the gate insulating film 7, and the first and second insulating layers 9 and 10. The semiconductor device 21 may also include an inter-layer insulator 11 that extends over the second diffusion region 5, the gate insulating film 7, and the second insulating layer 10. A contact plug 12 is disposed in the inter-layer insulator 11 and over the second diffusion region 5, so that the contact plug 12 is connected to the second diffusion region 5.

In some cases, the semiconductor substrate 1 and the semiconductor pillar 3 may be made of silicon. In some cases, the first and second diffusion regions 4 and 5 may be made of impurity-doped silicon such as As-doped silicon. In some cases, the first and second diffusion regions 4 and 5 can be implemented by, but not limited to, an impurity-doped region of the second side portion 3b of the pillar 3 and an impurity-doped region of the semiconductor substrate 1. Typically, the first and second diffusion regions 4 and 5 can perform as source and drain regions.

In some cases, each of the insulating film 6, the gate insulating film 7, the first and second insulating layers 9 and 10 and the inter-layer insulator 11 may be made of, but is not limited to, silicon oxide.

As described above, the gate electrode 8 is disposed on the gate insulating film 7, so that the gate electrode 8 horizontally confronts with the side surface of the body 35. In some cases, the gate electrode 8 may be surrounded by the first and second insulating layers 9 and 10. In some cases, the gate electrode 8 may be disposed between the first and second insulating layers 9 and 10. This structure configures the vertical MOS transistor.

In some cases, the second insulating layer 10 may be positioned over the top portion 8b of the gate electrode 8 and the first insulating layer 9. The second insulating layer 10 may horizontally surround the gate electrode 8, the gate insulating film 7 and the second diffusion region 5. The second insulating layer 10 may horizontally surround at least the second diffusion region 5. The top of the second insulating layer 10 may be higher than the top of the gate insulating film 7.

In some cases, the first insulating layer 9 may be disposed on the insulating film 6, so that the first insulating layer 9 covers the first diffusion region 4. The first insulating layer 9 is positioned under the gate electrode 8. The first insulating layer 9 and the insulating film 6 are formed over the surface 1c of the semiconductor substrate 1. The gate electrode 8 may be interposed between the upper portion of the second insulating layer 10 and the first insulating layer 9.

The upper portion of the second insulating layer 10 may horizontally surround the second diffusion region 5. The first insulating layer 9 may horizontally surround the first side portion 3a of the pillar 3. The body 35 of the pillar 3 is positioned under the second diffusion region 5 and over the first side portion 3a of the pillar 3. The gate electrode 8 is positioned under the upper portion of the second insulating layer 10 and over the first insulating layer 9. The gate electrode 8 horizontally overlaps the body 35 without horizontally overlapping the first and second diffusion regions 4 and 5. Reduced gate-overlap capacitance stabilizes the voltage-current characteristic of the vertical MOS transistor 21, thereby improving the reliability of the vertical MOS transistor 21.

The gate electrode 8 horizontally overlaps a part of the body 35 without horizontally overlapping the first and second diffusion regions 4 and 5. Reduced gate-overlap capacitance stabilizes the voltage-current characteristic of the vertical MOS transistor 21, thereby improving the reliability of the vertical MOS transistor 21.

In still other cases, the gate electrode 8 may horizontally surround not only all parts of the body 35 but also at least one of an upper portion of the first diffusion region 4 and an lower portion of the second diffusion portion 5. Reduced gate-overlap capacitance stabilizes the voltage-current characteristic of the vertical MOS transistor 21, thereby improving the reliability of the vertical MOS transistor 21.

A typical example of a method of forming the semiconductor device 21 that is shown in FIG. 1 will be described with reference to FIGS. 2A through 2P.

In some cases, a typical example of a method of forming the semiconductor device 21 may include, but not limited to or not essentially, forming the pillar 3, forming the first diffusion region 4, forming an insulating layer, forming a first insulating film, forming the gate insulating film 7, forming the gate electrode 8, forming a second insulating film, and forming the second diffusion region 5.

Figure 2A:
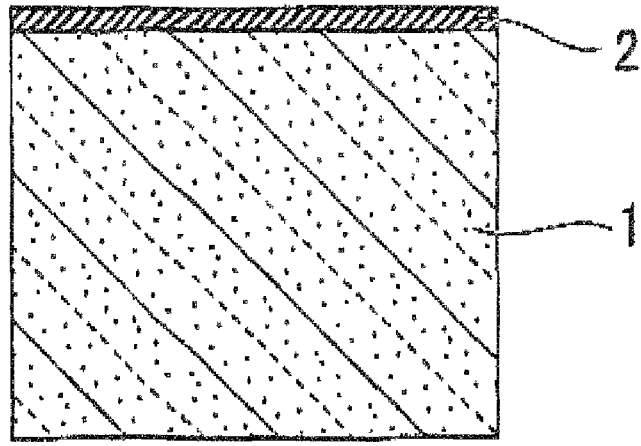
FIGS. 2A through 2P are fragmentary cross sectional elevation views illustrating sequential steps involved in a method of forming the semiconductor device shown in FIG. 1.

Process for Forming a Pillar:

With reference to FIG. 2A, a semiconductor substrate 1 made of silicon is prepared. A silicon oxide film 2 is formed on the surface of the semiconductor substrate 1. In some cases, the silicon oxide film 2 can be formed by a thermal oxidation process that is carried out at a temperature of, but not limited to, 1000° C. Typically, the thickness of the silicon oxide film 2 can be, but is not limited to, 10 nm.

Figure 2B:
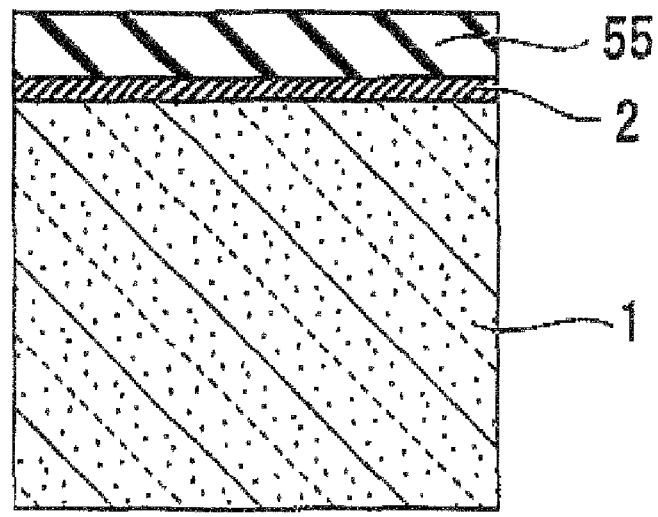

With reference to FIG. 2B, a silicon nitride film 55 is formed on the silicon oxide film 2. In some cases, the silicon nitride film 55 can be formed at a temperature of, but not limited to, 900° C. Typically, the thickness of the silicon nitride film 55 can be, but is not limited to, 100 nm.

Figure 2C:
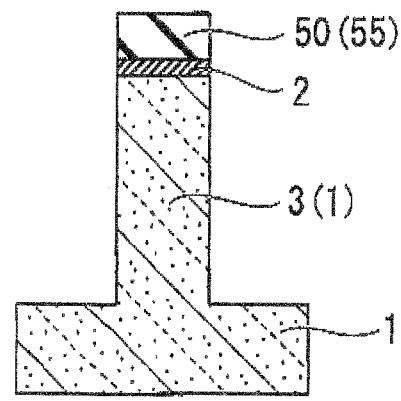

With reference to FIG. 2C, a resist film is applied on the silicon nitride film 55. A lithography process is carried out to pattern the resist film, thereby forming a resist pattern on the silicon nitride film 55. A dry etching process is cried out using the resist pattern as a mask, thereby patterning the silicon nitride film 55 and forming a silicon nitride mask layer 50. In some cases, the silicon nitride mask layer 50 may have a predetermined shape of pattern. Typically, bolt not essentially, the predetermined shape of pattern of the silicon nitride mask layer 50 may be a circle. In this case, the diameter of the circular pattern of the silicon nitride mask layer 50 may be, but is not limited to, 100 nm. In other cases, the predetermined shape of pattern of the silicon nitride mask layer 50 may also be, but is not limited to, an ellipse, a rectangle, other polygons, or modified shapes thereof.

A dry etching process is carried out using the silicon nitride mask layer 50 as a hard mask, thereby selectively etch the silicon oxide film 2 and the semiconductor substrate 1 so as to form a pillar 3 of silicon. In some cases, the depth of the dry etching for the semiconductor substrate 1 may be, but is not limited to, 200 nm. Thus, the pillar 3 of silicon vertically extends from the surface of the semiconductor substrate 1. Namely, the pillar 3 of silicon may be regarded as a part of the semiconductor substrate 1 which projects vertically and is positioned under the silicon nitride mask layer 50. The shape in plan view of the pillar 3 of silicon is defined by the predetermined pattern shape of the silicon nitride mask layer 50. The pillar 3 of silicon has first-side and second-side portions 3a and 3b, wherein the first side portion 3a is proximal to the semiconductor substrate 1, while the second side portion 3b is distal from the semiconductor substrate 1.

Figure 2D:
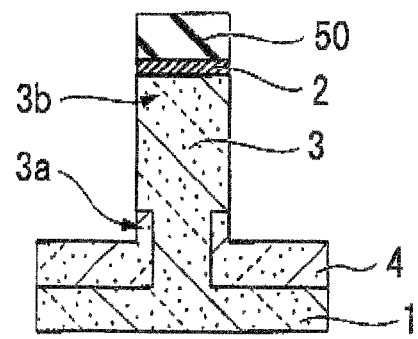

Process for Forming First Diffusion Region:

With reference to FIG. 2D, a dopant is introduced into the surface region of the semiconductor substrate 1 and a peripheral side region of the first side portion 3a of the pillar 3 of silicon, thereby forming a first diffusion region 4. Typically, the first diffusion region 4 extends to share the surface region of the semiconductor substrate 1 and the peripheral side region of the first-side portion 3a of the pillar 3 of silicon. In some cases, the introduction of a dopant can be implemented by, but not limited to, an ion-implantation process. Arsenic (As) can be introduced at acceleration energy of 10 keV and at a dose of 1E15 $cm^{-2}$.

Figure 2E:
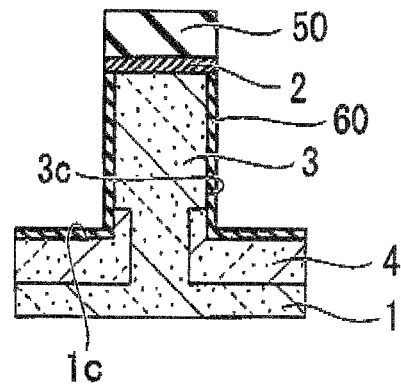

Process for Forming Insulating Layer:

With reference to FIG. 2E, the pillar 3 of silicon has a side surface 3c. The semiconductor substrate 1 has the surface 1c. A thermal oxidation process is carried out to form a silicon oxide film 60 which extends along the side surface 3c of the pillar 3 and over the surface 1c of the semiconductor substrate 1. In some cases, the thermal oxidation process can be carried out at a temperature of, but not limited to, 1000° C. Typically, the thickness of the silicon oxide film 60 can be, but is not limited to, 5 nm.

Figure 2F:
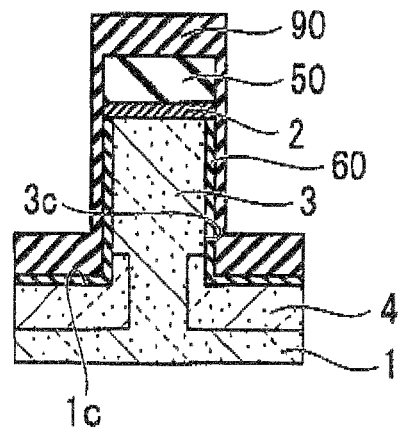

With reference to FIG. 2F, a silicon oxide layer 90 is formed on the silicon nitride mask layer 50 and on the silicon oxide film 60. In some cases, the silicon oxide layer 90 can be formed by, but not limited to, a high density plasma chemical vapor deposition process. The silicon oxide layer 90 has thicker and thinner portions. The thicker portions of the silicon oxide film 90 may be regarded as a vertically grown portion of the silicon oxide film 90 which has been grown in the vertical direction to the surface 1c of the semiconductor substrate 1. The thinner portion of the silicon oxide film 90 may be regarded as a horizontally grown portion of the silicon oxide film 90 which has been grown in the horizontal direction parallel to the surface 1c of the semiconductor substrate 1. The thicker portions of the silicon oxide film 90 extend over the silicon nitride mask layer 50 and over the surface 1c of the semiconductor substrate 1. The thinner portion of the silicon oxide film 90 extends along the side surface 3c of the pillar 3. The reason why the silicon oxide layer 90 is formed so as to have thicker and thinner portions is that isotropically etching the silicon oxide layer 90 results in the resides of the silicon oxide film 90 over the silicon nitride mask layer 50 and the surface 1c of the semiconductor substrate 1, with no reside of the silicon nitride mask layer 50 along the side surface 3c of the pillar 3. In some cases, the thickness of the thicker portion of the silicon oxide film 90 may be, but is not limited to, 50 nm, while the thickness of the thinner portion of the silicon oxide film 90 may be, but is not limited to, 10 nm.

Figure 2G:
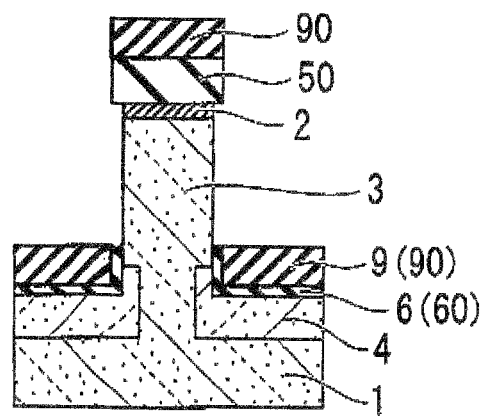

Process for Forming First Insulating Film:

With reference to FIG. 2G, an isotropic etching process is carried out to isotropically etch the silicon oxide film 90, thereby leaving the thicker portions of the silicon oxide film 90 over the silicon nitride mask layer 50 and the surface 1c of the semiconductor substrate 1, while removing the thinner portion of the silicon oxide film 90 from the side surface 3c of the pillar 3. The isotropic etching process further selectively removes the silicon oxide film 60 that extends along the side surface 3c of the pillar 3, while leaving the silicon oxide film 60 that extends along the first diffusion region 4, so that the side surface 3c of the pillar 3 is exposed. The remaining portion of the silicon oxide film 60 serves as an insulating film 6. In some cases, the isotropic etching process can be implemented by, but is not limited to, a wet etching process. The wet etching depth is deeper than the thickness of the thinner portion of the silicon oxide film 90 but shallower than the thickness of the thicker portions of the silicon oxide film 90, so as to leave the thicker portions of the silicon oxide film 90 while removing the thinner portion of the silicon oxide film 90. In some cases, the wet etching depth may be, but is not limited to, 15 nm. As a result of the isotropic etching process, one of the remaining portions of the silicon oxide film 90 over the surface 1c of the semiconductor substrate 1 serves as a first insulating layer 9. Further, the remaining portion of the silicon oxide film 60 that is interposed between the first diffusion region 4 and the first insulating layer 9 serves as the insulating film 6. Thus, as a result of the isotropic etching process, the silicon oxide film 90 is formed over the silicon nitride mask layer 50, while the insulating film 6 is formed which covers the first diffusion region 4 as well as the first insulating layer 9 is formed over the insulating film 6.

Figure 2H:
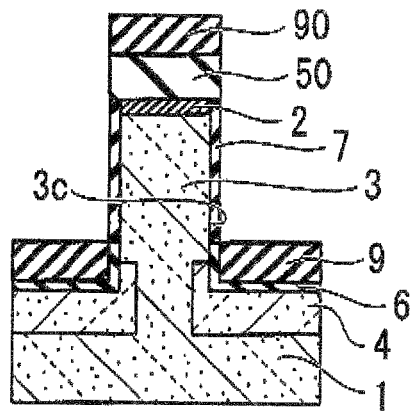

Process for Forming Gate Insulating Film:

With reference to FIG. 2H, a gate insulating film 7 is formed on the exposed side surface 3c of the pillar 3. In some cases, the gate insulating film 7 can be formed by, but not limited to, a thermal oxidation process. The thermal oxidation process can be carried out at a temperature of, but not limited to, 1000° C. Typically, the thickness of the gate insulating film 7 can be, but is not limited to, 5 nm. The side surface 3c of the pillar 3 is covered by the gate insulating film 7.

Figure 2I:
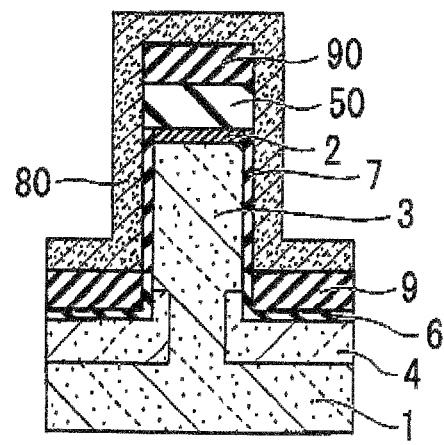

Process for Forming Gate Electrode:

With reference to FIG. 2I, a gate electrode layer 80 is entirely formed which extends along the top surface of the silicon oxide film 90, the side faces of the silicon oxide film 90 and the silicon nitride mask layer 50, the surface of the gate insulating film 7, and the upper surface of the first insulating layer 9. The gate electrode layer 80 covers the silicon oxide film 90, the silicon nitride mask layer 50, the gate insulating film 7, and the first insulating layer 9. The gate electrode layer 80 is separated by the gate insulating film 7 from the pillar 3. In some cases, the gate electrode layer 80 can be implemented by a doped polysilicon film. In some cases, the gate electrode layer 80 can be formed by a chemical vapor deposition process. Typically, the thickness of the gate electrode layer 80 can be, but is not limited to, 30 nm.

Figure 2J:
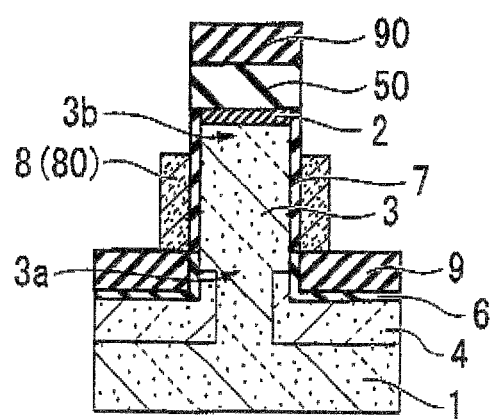

With reference to FIG. 2J, an anisotropic etching process is carried out to selectively etch the gate electrode layer 80, thereby forming a gate electrode 8 on the gate insulating film 7. Typically, the gate electrode layer 80 can be removed from the upper surface of the first insulating layer 9 and also from the upper portion of the gate insulating film 7, the side faces of the silicon oxide film 90 ad the silicon nitride mask layer 50 as well as from the top surface of the silicon oxide film 90. In other words, the gate electrode layer 80 can remain on the gate insulating film 7, except on the upper portion of the gate insulating film 7. The top of the gate electrode 8 is lower in level than the boundary between the second side portion 3b of the pillar 3 and the silicon oxide film 2. Namely, the top of the gate electrode 8 is lower in level than the top of the pillar 3. In some cases, the top of the gate electrode 8 can be lower in level by 30 nm than the top of the pillar 3. The upper portion of the gate insulating film 7 is exposed. The bottom of the gate electrode 8 is bounded with the upper surface of the first insulating layer 9. The bottom of the gate electrode 8 may be just or nearly equal in level to or higher in level than the top portion of the first diffusion region 4. The gate electrode 8 does not horizontally overlap the first diffusion region 4. The gate electrode 8 does not horizontally surround the first diffusion region 4. The gate electrode 8 horizontally overlaps the pillar 3, except for its upper region. The gate electrode 8 horizontally surrounds the pillar 3, except for its upper region.

Figure 2K:
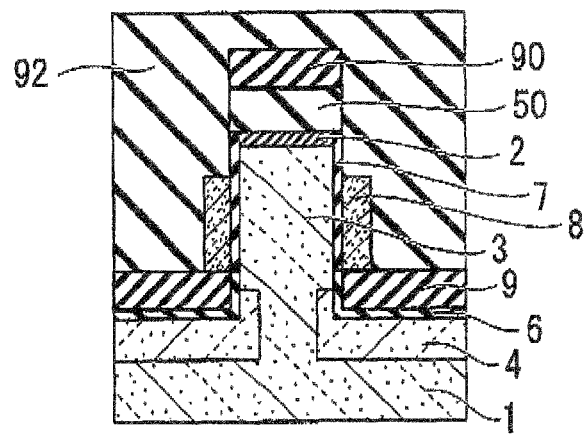

Process for Forming Second Insulating Film:

With reference to FIG. 2K, an insulating film 92 is formed which buries the pillar 3 and the semiconductor substrate 1. The insulating film 92 covers the silicon oxide film 90, the silicon nitride mask layer 50, the upper portion of the gate insulating film 7, the gate electrode 8, and the first insulating layer 9. In some cases, the insulating film 92 can be formed by, but not limited to, a high density plasma chemical vapor deposition process. Typically, the thickness of the insulating film 92 can be, but is not limited to, 500 nm.

Figure 2L:
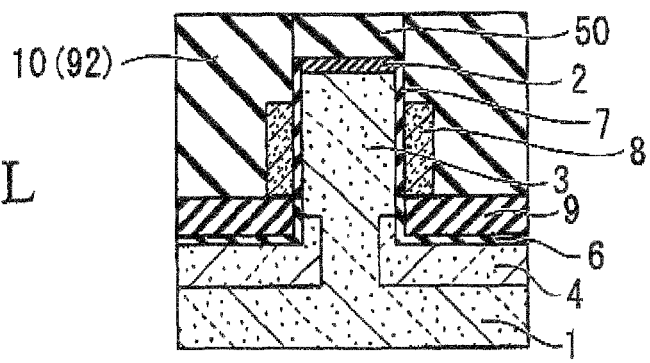

With reference to FIG. 2L, a planarization process is carried out to selectively remove the insulating film 92 and entirely remove the silicon oxide film 90, so that the top surface of the silicon nitride mask layer 50 is exposed, and that the remaining portion of the insulating film 92 serves as a second insulating layer 10. In some cases, the planarization process can be carried out by, but not limited to, a chemical mechanical polishing process.

Figure 2M:
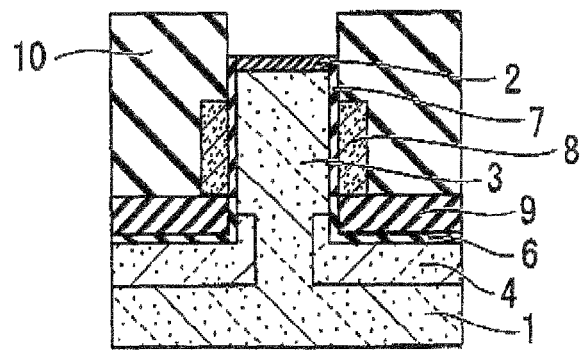

Process for Forming Second Diffusion Region:

With reference to FIG. 2M, a wet etching process is carried out to remove the silicon nitride mask layer 50, so that the top surface of the silicon oxide film 2 is exposed, and a hollowed portion is formed over the silicon oxide film 2.

Figure 2N:
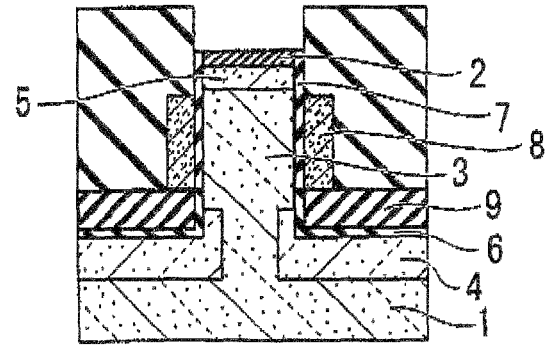

With reference to FIG. 2N, a dopant is introduced into the second side portion 3b of the pillar 3 through the silicon oxide film 2, thereby forming a second diffusion region 5 in the second side portion 3b of the pillar 3. The introduction of a dopant can be carried out by, but is not limited to, an ion-implantation process. In some cases, the ion-implantation process can be carried out at acceleration energy of 10 keV and a dose of $1E15\ cm^{-2}$.

The bottom of the second diffusion region 5 is bounded with the top of the pillar 3. The pillar 3 has a body 35 which is illustrated in FIG. 1. The body 35 of the pillar 3 is vertically interposed between the first and second diffusion regions 4 and 5. The body 35 of the pillar 3 is positioned in level below the second diffusion region 5 and above the first diffusion region 4. The bottom portion of the second diffusion region 5 may be just or nearly equal in level to or higher in level than the top portion of the gate electrode 8. The gate electrode 8 does not horizontally overlap the first diffusion region 4. The gate electrode 8 does not horizontally surround the second diffusion region 5. The gate electrode 8 horizontally overlaps the body 35 of the pillar 3. The gate electrode 8 horizontally surrounds the body 35 of the pillar 3.

Consequently, the gate electrode 8 may horizontally overlap, at least at part of the body 35, but typically may overlap all of the body 35, while the gate electrode 8 does not horizontally overlap the first and second diffusion regions 4 and 5. In some cases, the top portion of the gate electrode 8 may be just or nearly equal in level to or lower in level than the bottom of the second diffusion region 5. The bottom portion of the gate electrode 8 may be just or nearly equal in level to or higher in level than the top of the first diffusion region 4.

Figure 2O:
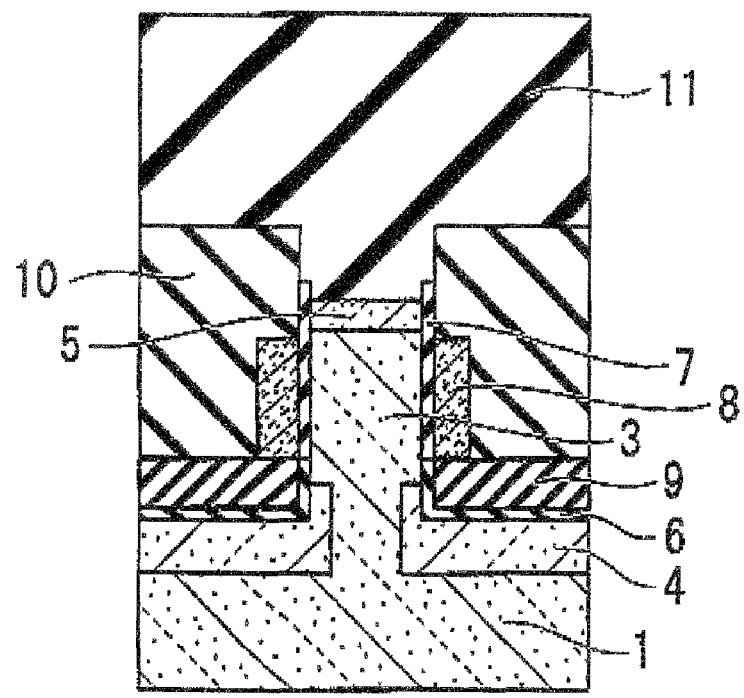

With reference to FIG. 2O, an inter-layer insulator 11 is formed over the second diffusion region 5, the gate insulating film 7 and the second insulating layer 10. The inter-layer insulator 11 covers the pillar 3 and the semiconductor substrate 1. In some cases, the inter-layer insulator 11 can be implemented by, but is not limited to, an oxide film. Typically, the thickness of the inter-layer insulator 11 can be, but is not limited to, 300 nm.

Figure 2P:
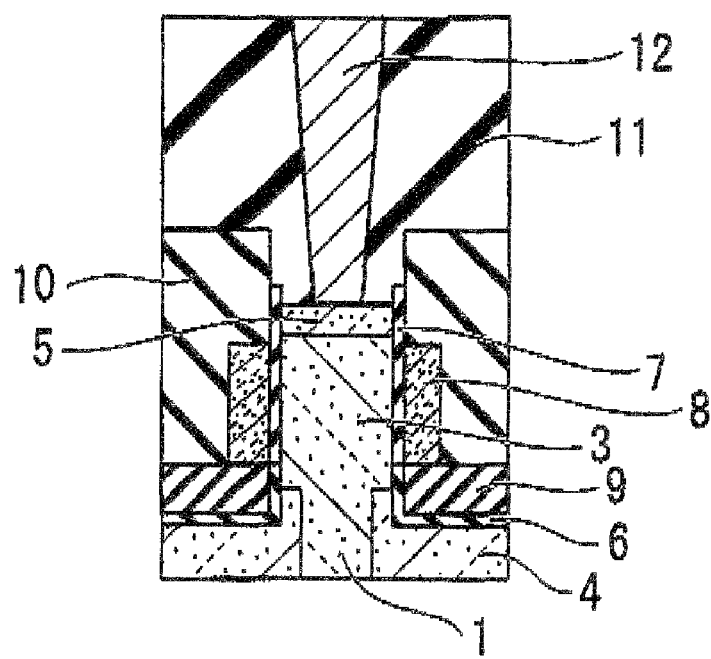

With reference to FIG. 2P, a resist film is applied on the inter-layer insulator 11. A lithography process is carried out to pattern the resist film, thereby forming a resist pattern on the inter-layer insulator 11. A dry etching process is carried out using the resist pattern as a mask to selectively etch the inter-layer insulator 11, thereby forming a contact hole which reaches the second diffusion region 5. A contact plug 12 is then formed in the contact hole in the inter-layer insulator 11, wherein the contact plug 12 is electrically connected to the second diffusion region 5. Optionally, but not essentially, an additional planarization process can be carried out to improve the planarity of the inter-layer insulator 11. In some cases, the additional planarization process can be implemented by, but is not limited to, a chemical mechanical polishing process.

In accordance with the above described first preferred embodiment, the high density plasma chemical vapor deposition process can be available to form the silicon oxide layer 90 which has the thicker and thinner portions. The thicker portions of the silicon oxide film 90 is a vertically grown portion of the silicon oxide film 90 which has been grown in the vertical direction to the surface 1c of the semiconductor substrate 1. The thinner portion of the silicon oxide film 90 is a horizontally grown portion of the silicon oxide film 90 which has been grown in the horizontal direction parallel to the surface 1c of the semiconductor substrate 1. The thicker portions of the silicon oxide film 90 extend over the silicon nitride mask layer 50 and over the surface 1c of the semiconductor substrate 1. The thinner portion of the silicon oxide film 90 extends along the side surface 3c of the pillar 3. The thinner portion of the silicon oxide film 90 surrounds the side surface 3c of the pillar 3. Thus, isotropically etching the silicon oxide layer 90 results in the resides of Et silicon oxide film 90 over the silicon nitride mask layer 50 and over the surface 1c of the semiconductor substrate 1, while removing the silicon nitride mask layer 50 from the side surface 3c of the pillar 3. The gate electrode 8 does not horizontally overlap the first diffusion region 4. The gate electrode 8 does not horizontally surround the first diffusion region 4. The gate electrode 8 horizontally overlaps the pillar 3, except for its upper region. The gate electrode 8 horizontally surrounds the pillar 3, except for its upper region.

The gate electrode layer 80 is removed from the upper surface of the first insulating layer 9 and also from the upper portion of the gate insulating film 7, the side faces of the silicon oxide film 90 and the silicon nitride mask layer 50 as well as from the top surface of the silicon oxide film 90. Further, the second diffusion region 5 is formed, so that the bottom portion of the second diffusion region 5 may be just or nearly equal in level to or higher in level than the top portion of the gate electrode 8. The gate electrode 8 does not horizontally overlap the first diffusion region 4. The gate electrode 8 does not horizontally surround the second diffusion region 5. The gate electrode 8 horizontally overlaps the body 35 of the pillar 3. The gate electrode 8 horizontally surrounds the body 35 of the pillar 3.

Consequently, the gate electrode 8 may horizontally overlap, at least at part of the body 35, but typically may overlap all of the body 35 without horizontally overlapping the first and second diffusion regions 4 and 5. In some cases, the top portion of the gate electrode 8 may be just or nearly equal in level to or lower in level than the bottom of the second diffusion region 5. The bottom portion of the gate electrode 8 may be just or nearly equal in level to or higher in level than the top of the first diffusion region 4. Reduced gate-overlap capacitance stabilizes the voltage-current characteristic of the vertical MOS transistor 21, thereby improving the reliability of the vertical MOS transistor 21.

In briefly, the method of forming the semiconductor device may include the following processes. A pillar of semiconductor is formed, which extends from the semiconductor substrate generally in a vertical direction to the surface of the semiconductor substrate. The pillar of semiconductor has top and bottom portions and a side surface. A first diffusion region is formed near the bottom portion of the pillar of semiconductor and in the semiconductor substrate. A first insulating layer is formed which extends along the top and side surface of the pillar and the surface of the semiconductor substrate. The first insulating layer has thinner and thicker portions. The thinner portion extends along the side surface of the pillar. The thicker portion extends along the surface of the semiconductor substrate. A first isotropic etching process is carried out to selectively etch the first insulating layer, thereby leaving the first insulating layer on the surface of the semiconductor substrate, while removing the first insulating layer from the side surface of the pillar to expose the side surface of the pillar. A gate insulating film is formed on the side surface of the pillar. A conductive layer is formed, which extends along the gate insulating film. A second anisotropic etching process is carried out to selective etch the conductive layer, thereby forming a gate electrode on the gate insulating film. The gate electrode is separated by the gate insulating film from the pillar. The gate electrode has a bottom portion that is just or nearly equal in level to or higher in level than the top of the first diffusion region. The gate electrode has a top portion that is lower in level than the top of the pillar. A second diffusion region is formed in an upper region of the pillar, the second diffusion region having a bottom portion that is just or nearly equal in level to or higher in level than the top portion of the gate electrode. The first insulating layer is formed by carrying out a high density plasma chemical vapor deposition process. Further, a second insulating layer is formed, which covers the gate insulating film and the gate electrode, before forming the second diffusion region. The second insulating layer is formed by carrying out a high density plasma chemical vapor deposition process. A base oxide film is formed, which extends along the side surface of the pillar and the surface of the semiconductor substrate, before forming the first insulating layer on the base oxide film. The base oxide film has a uniform thickness. The pillar of semiconductor is formed by forming a first hard mask over the semiconductor substrate, and anisotropically etching the semiconductor substrate by using the first hard mask, thereby forming the pillar under the first hard mask.

Second Embodiment

Figure 3:
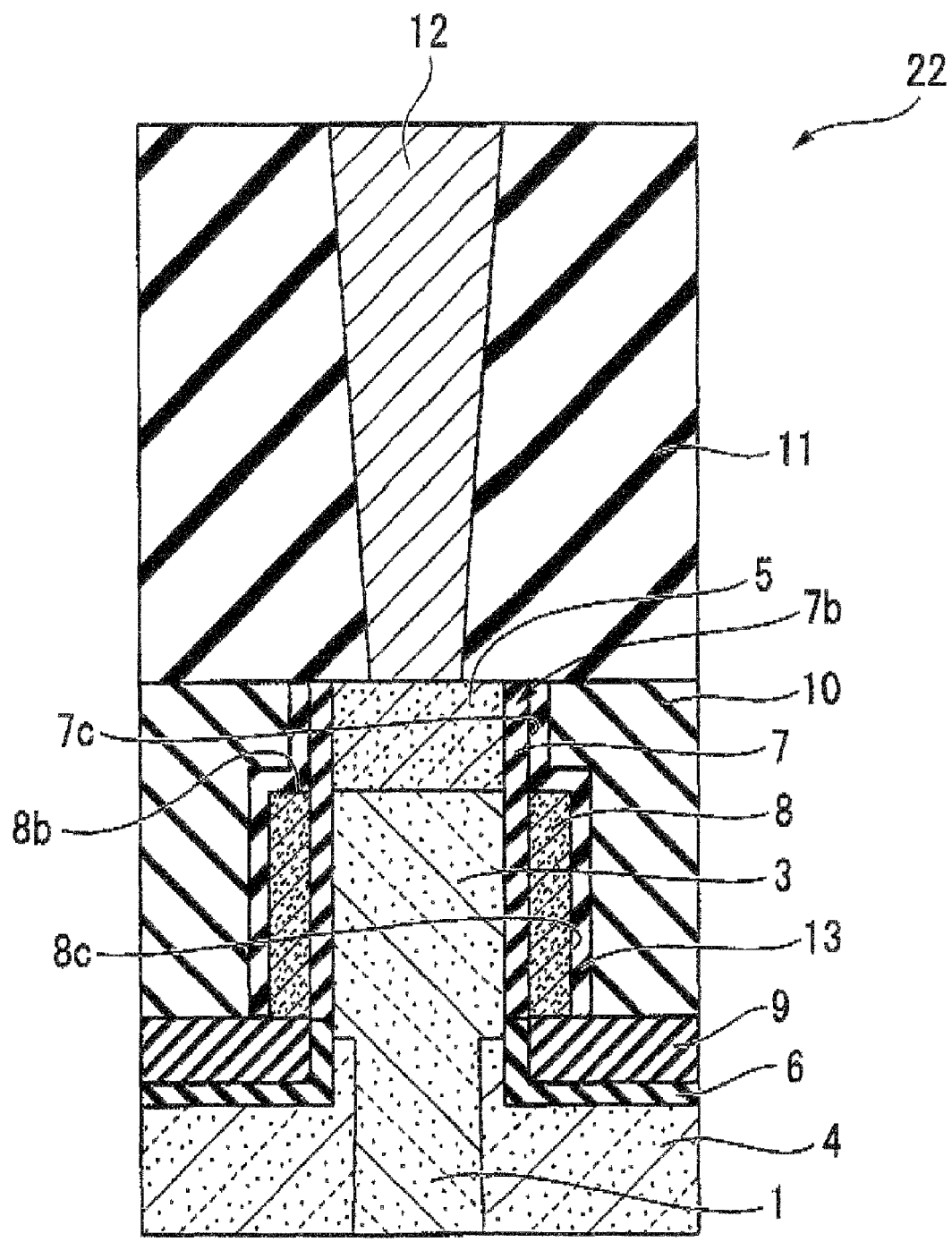
FIG. 3 is a fragmentary cross sectional elevation view illustrating a semiconductor device in accordance with a second preferred embodiment of the present invention.

A semiconductor device 22 will be described in accordance with a second preferred embodiment of the present invention. With reference to FIG. 3, a semiconductor device 22 may have the same structure as the above-described semiconductor device 21, except for an additional passivation oxide film 13. The additional passivation oxide film 13 extends along the outside surface 8c of the gate electrode 8, the top portion 8b of the gate electrode 8 and the upper portion 7b of the gate insulating film 7. The second insulating layer 10 extends along the passivation oxide film 13.

The semiconductor device 22 may also include the gate electrode 8 that is disposed on the gate insulating film 7, so that the gate electrode 8 surrounds the body 35 of the pillar 3 circumferentially and horizontally without surrounding the first and second diffusion regions 4 and 5. The gate electrode 8 is separated by the gate insulating film 7 from the side surface 3c of the pillar 3. The gate electrode 8 is opposed to the side surface 3c of the pillar 3. The term "opposed to" means that the gate electrode 8 is positioned in the opposite side of the gate insulating film 7 to the side in which the pillar 7 is positioned. In general, the gate electrode 8 may horizontally overlap, at least at part of the body 35, but typically may overlap all of the body 35, while the gate electrode 8 does not horizontally overlap the first and second diffusion regions 4 and 5. In some cases, the top portion of the gate electrode 8 may be just or nearly equal in level to or lower in level than the bottom of the second diffusion region 5. The bottom portion of the gate electrode 8 may be just or nearly equal in level to or higher in level than the top of the first diffusion region 4. Reduced gate-overlap capacitance stabilizes the voltage-current characteristic of the vertical MOS transistor 22, thereby improving the reliability of the vertical MOS transistor 22.

In other cases, the gate electrode 8 horizontally overlaps a part of the body 35 without horizontally overlapping the first and second diffusion regions 4 and 5. Reduced gate-overlap capacitance stabilizes the voltage-current characteristic of the vertical MOS transistor 22, thereby improving the reliability of the vertical MOS transistor 22.

In still other cases, the gate electrode 8 may horizontally surround not only all parts of the body 35 but also at least one of an upper portion of the first diffusion region 4 and an lower portion of the second diffusion portion 5. Reduced gate-overlap capacitance stabilizes the voltage-current characteristic of the vertical MOS transistor 22, thereby improving the reliability of the vertical MOS transistor 22.

The passivation oxide film 13 between the gate electrode 8 and the second insulating layer 10 reduces gate-overlap capacitance. Reduced gate-overlap capacitance stabilizes the voltage-current characteristic of the vertical MOS transistor 22, thereby improving the reliability of the vertical MOS transistor 22.

A typical example of a method of forming the semiconductor device 22 that is shown in FIG. 3 will be described with reference to FIGS. 4A through 4K.

In some cases, a typical example of a method of forming the semiconductor device 22 may include, but not limited to or not essentially, forming the pillar 3, forming the first diffusion region 4, narrowing the pillar 3, forming an insulating layer, forming a first insulating film, forming the gate insulating film 7, forming the gate electrode 8, forming the passivation oxide film 13, forming a second insulating film, and forming the second diffusion region 5. Narrowing the pillar 3 and forming the passivation oxide film 13 are additional processes.

The processes for forming the pillar 3 as described with reference to FIGS. 2A through 2C are carried out in the same manner as in the first preferred embodiment. Further, the process for forming the first diffusion region 4 as described with reference to FIG. 2D is then carried out in the same manner as in the first preferred embodiment. The pillar 3 of silicon has a side surface 3c. The semiconductor substrate 1 has the surface 1c.

Figure 4A:
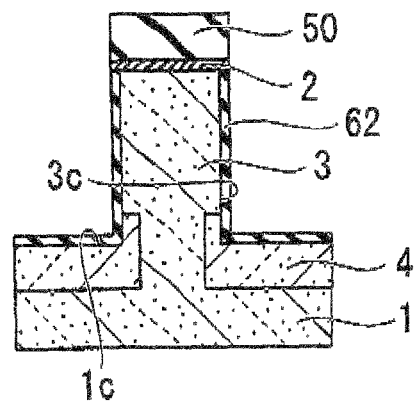
FIGS. 4A through 4K are fragmentary cross sectional elevation views illustrating sequential steps involved in a method of forming the semiconductor device shown in FIG. 3.

Process for Narrowing Pillar:

With reference to FIG. 4A, a dummy oxide film 62 is formed on the side surface of the pillar 3 and on the surface 1c of the semiconductor substrate 1. In some cases, the dummy oxide film 62 can be formed by a the oxidation process for thermally oxidizing the surface region of the side surface 3c of the pillar 3. The thermal oxidation of the surface region of the side surface 3c of the pillar 3 narrows the pillar 3. In some cases, the thermal oxidation process can be carried out at a temperature of, but not limited to, 1000° C. Typically, the thickness of the dummy oxide film 62 can be, but is not limited to, 5 nm.

Figure 4B:
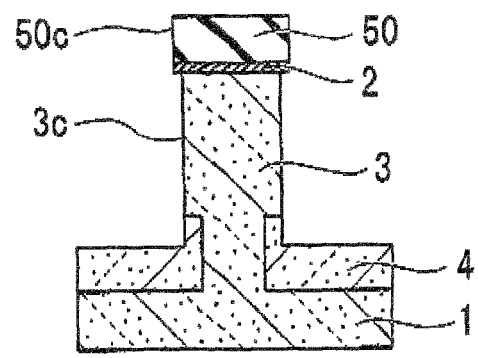

With reference to FIG. 4B, a wet etching process is carried out to remove the dummy oxide film 62, thereby exposing the side surface 3c of the narrowed pillar 3. The side surface 3c of the narrowed pillar 3 is positioned more inside than the side edge 50c of the silicon nitride mask layer 50. The side surface 3c of the narrowed pillar 3 is positioned more inside than the side edge 50c of the silicon nitride mask layer 50 by a horizontal dimension that corresponds to the thickness of the dummy oxide film 62. If the thickness of the dummy oxide film 62 is 5 nm, then the side surface 3c of the narrowed pillar 3 is positioned more inside by 5 nm tan the side edge 50c of the silicon nitride mask layer 50. In some cases, the thickness of the dummy oxide film 62 may be set in the range of, but not limited to, 1 nm to 15 nm. The thickness of the dummy oxide film 62 may be determined depending upon the dimension or side of the pillar 3 and/or the shape of the pillar 3.

Figure 4C:
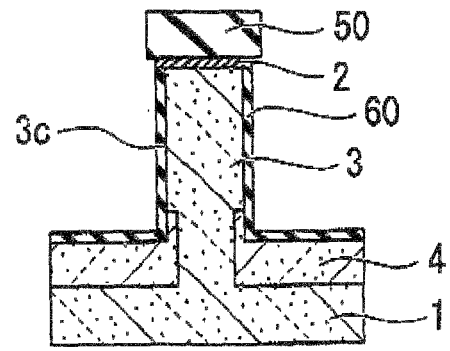

Process for Forming Insulating Layer:

With reference to FIG. 4C, a thermal oxidation process is carried out to form a silicon oxide film 60 which extends along the side surface 3c of the narrowed pillar 3 and over the surface 1c of the semiconductor substrate 1. In some cases, the thermal oxidation process can be carried out at a temperature of, but not limited to, 1000° C. Typically, the thickness of the silicon oxide film 60 can be, but is not limited to, 5 nm.

Figure 4D:
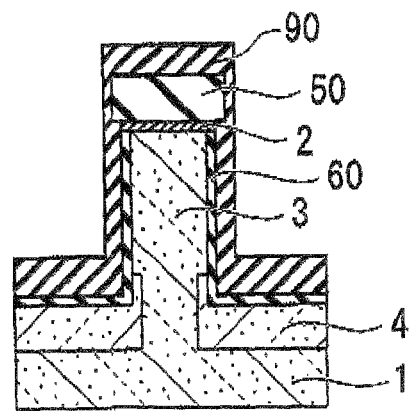

With reference to FIG. 4D, a silicon oxide layer 90 is formed on the silicon nitride mask layer 50 and on the silicon oxide film 60. In some cases, the silicon oxide layer 90 can be formed by, but is not limited to, a high density plasma chemical vapor deposition process. Be silicon oxide layer 90 has thicker and thinner portions. The thicker portions of the silicon oxide film 90 may be regarded as a vertically grown portion of the silicon oxide film 90 which has been grown in the vertical direction to the surface 1c of the semiconductor substrate 1. The thinner portion of the silicon oxide film 90 may be regarded as a horizontally grown portion of the silicon oxide film 90 which has been grown in the horizontal direction parallel to the surface 1c of the semiconductor substrate 1. The thicker portions of the silicon oxide film 90 extend over the silicon nitride mask layer 50 and over the surface 1c of the semiconductor substrate 1. The thinner portion of the silicon oxide film 90 extends along the side surface 3c of the pillar 3. The reason why the silicon oxide layer 90 is formed so as to have thicker and thinner portions is that isotropically etching the silicon oxide layer 90 results in the resides of the silicon oxide film 90 over the silicon nitride mask layer 50 and the surface 1c of the semiconductor substrate 1, with no reside of the silicon nitride mask layer 50 along the side surface 3c of the pillar 3. In some cases, the thickness of the thicker portion of the silicon oxide film 90 may be, but is not limited to, 50 nm, while the thickness of the thinner portion of the silicon oxide film 90 may be, but is not limited to, 10 nm.

Figure 4E:
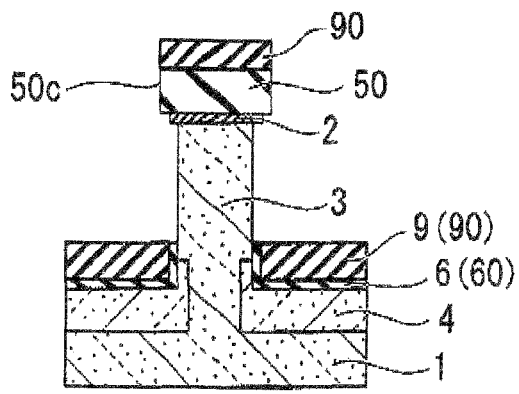

Process for Forming First Insulating Film:

With reference to FIG. 4E, an isotropic etching process is carried out to isotropically etch the silicon oxide film 90, thereby leaving the thicker portions of the silicon oxide film 90 over the silicon nitride mask layer 50 and the surface 1c of the semiconductor substrate 1, while removing the thinner portion of the silicon oxide film 90 from the side surface 3c of the pillar 3. The isotropic etching process further selectively removes the silicon oxide film 60 that extends along the side surface 3c of the pillar 3, while leaving the silicon oxide film 60 that extends along the first diffusion region 4, so that the side surface 3c of the pillar 3 is exposed. The remaining portion of the silicon oxide film 60 serves as an insulating film 6. In some cases, the isotropic etching process can be implemented by, but is not limited to, a wet etching process. The wet etching depth is deeper than the thickness of the thinner portion of the silicon oxide film 90 but shallower than the thickness of the thicker portions of the silicon oxide film 90, so as to leave the thicker portions of the silicon oxide film 90 while removing the thinner portion of the silicon oxide film 90. In some cases, the wet etching depth may be, but is not limited to, 15 nm. As a result of the isotropic etching process, one of the remaining portions of the silicon oxide film 90 remains over the surface 1c of the semiconductor substrate 1 serves as a first insulating layer 9. Further, the remaining portion of the silicon oxide film 60 that is interposed between the first diffusion region 4 and the first insulating layer 9 serves as the insulating film 6. Thus, as a result of the isotropic etching process, the silicon oxide film 90 is formed over the silicon nitride mask layer 50, while the insulating film 6 is formed which covers the first diffusion region 4 as well as the first insulating layer 9 is formed over the insulating film 6.

Figure 4F:
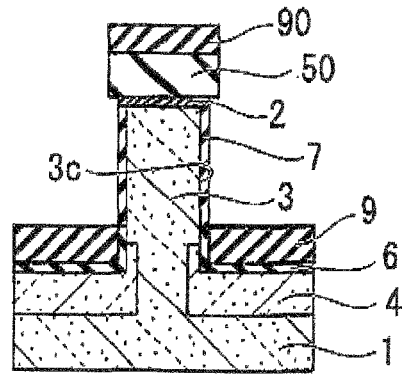

Process for Forming Gate Insulating Film:

With reference to FIG. 4F, a gate insulating film 7 is formed on the exposed side surface 3c of the pillar 3. In some cases, the gate insulating film 7 can be formed by, but not limited to, a thermal oxidation process. The thermal oxidation process can be carried out at a temperature of, but not limited to, 1000° C. Typically, the thickness of the gate insulating film 7 can be, but is not limited to, 5 nm. The side surface 3c of the pillar 3 is covered by the gate insulating film 7.

Figure 4G:
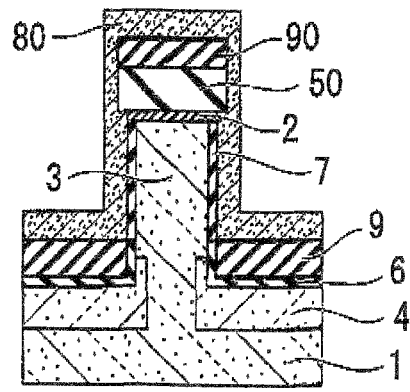

Process for Forming Gate Electrode:

With reference to FIG. 4G, a gate electrode layer 80 is entirely formed which extends along the top surface of the silicon oxide film 90, the side faces of the silicon oxide film 90 and the silicon nitride mask layer 50, the surface of the gate insulating film 7, and the upper surface of the first insulating layer 9. The gate electrode layer 80 covers the silicon oxide film 90, the silicon nitride mask layer 50, the gate insulating film 7, and the first insulating layer 9. The gate electrode layer 80 is separated by the gate insulating film 7 from the pillar 3. In some cases, the gate electrode layer 80 can be implemented by a doped polysilicon film. In some cases, the gate electrode layer 80 can be formed by a chemical vapor deposition process. Typically, the thickness of the gate electrode layer 80 can be, but is not limited to, 30 nm.

Figure 4H:
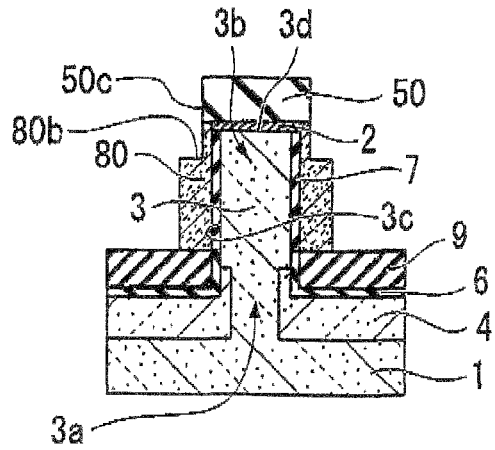

With reference to FIG. 4H, an anisotropic etching process is carried out to selectively etch the gate electrode layer 80. The gate electrode layer 80 has an upward face 80b at which the anisotropic etching process is stopped. The upward face 80b is lower in level than the boundary 3d of the pillar 3 and the silicon oxide film 2 by a predetermined amount. In some cases, the upward face 80b is lower in level than the boundary 3d by, but not limited to, 30 nm. The gate electrode layer 80 has thinner and thicker portions, wherein the thicker portion is positioned below the upward face 80b, while the thinner portion is positioned above the upward face 80b and under the side edge of the silicon nitride mask layer 50. The side edge of the silicon nitride mask layer 50 is positioned outside more than the gate insulating film 7. The side surface of the thicker portion of the gate electrode layer 80 is positioned outside more than the side edge of the silicon nitride mask layer 50. Typically, the gate electrode layer 80 can be removed from the upper surface of the first insulating layer 9 and also from the side faces of the silicon oxide film 90 and the silicon nitride mask layer 50 as well as from the top surface of the silicon oxide film 90. In other words, the gate electrode layer 80 can remain on the gate insulating film 7. The silicon oxide film 90 is further removed from the silicon nitride mask layer 50. The upper portion of the gate insulating film 7 remains covered by the thinner portion of the gate electrode layer 80. The thinner portion of the gate electrode layer 80 can prevent the gate insulating film 7 from being damaged by the anisotropic etching process, thereby improving the gate breakdown voltage characteristics.

Figure 4I:
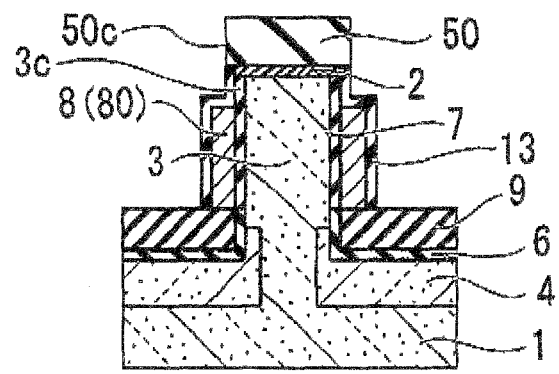

Process for Forming Passivation Oxide Film:

With reference to FIG. 4I, a thermal oxidation process is cared out to oxidize the surface region of the gate electrode layer 80, thereby forming a passivation oxide film 13. The thinner portion of the gate electrode layer 80 is entirely oxidized, while the thicker portion of the gate electrode layer 80 is partially oxidized, whereby the unoxidized portion of the thicker portion of the gate electrode layer 80 becomes the gate electrode 8. The passivation oxide film 13 thus extends along the upper portion of the gate insulating film 7 and the top and side surface of the gate electrode 8. The level of the top portion of the gate electrode is closer to the level of the upward face 80b of the gate electrode layer 80. The bottom of the gate electrode 8 is bounded with the upper surface of the first insulating layer 9. The bottom of the gate electrode 8 may be just or nearly equal in level to or higher in level than the top portion of the first diffusion region 4. The gate electrode 8 does not horizontally overlap the first diffusion region 4. The gate electrode 8 does not horizontally surround the first diffusion region 4. The gate electrode 8 horizontally overlaps the pillar 3, except for its upper region. The gate electrode 8 horizontally surrounds the pillar 3, except for its upper region.

Figure 4J:
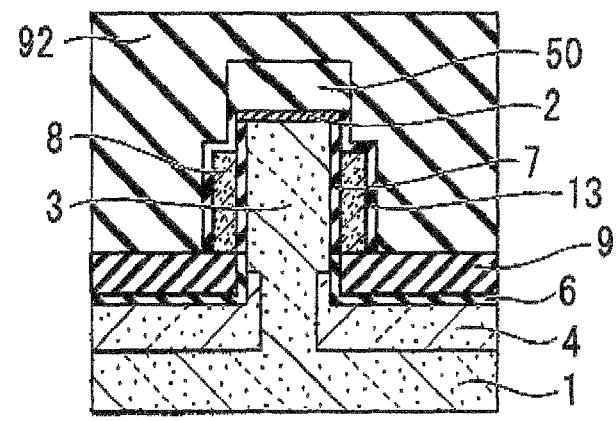

Process for Forming Second Insulating Film:

With reference to FIG. 4J, an insulating film 92 is formed which buries the pillar 3 and the semiconductor substrate 1. The insulating film 92 covers the silicon nitride mask layer 50, the upper portion of the gate insulating film 7, the gate electrode 8, and the first insulating layer 9. In some cases, the insulating film 92 can be formed by, but not limited to, a high density plasma chemical vapor deposition process. Typically, the thickness of the insulating film 92 can be, but is not limited to, 500 nm.

Figure 4K:
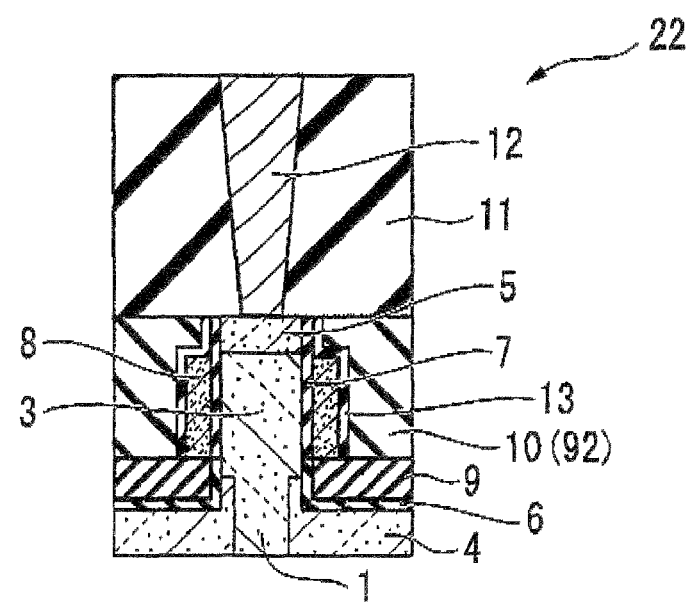

With reference to FIG. 4K, a planarization process is cared out to selectively remove the insulating film 92, so that the top surface of the silicon nitride mask layer 50 is exposed, and that the remaining portion of the insulating film 92 serves as a second insulating layer 10. In some cases, the planarization process can be carried out by, but not limited to, a chemical mechanical polishing process.

As described above, the passivation oxide film 13 thus extends along the upper portion of the gate insulating film 7 and the top and side surface of the gate electrode 8. The additional passivation oxide film 13 extends along the outside surface 8c of the gate electrode 8, the top portion 8b of the gate electrode 8 and the upper portion 7b of the gate insulating film 7. The second insulating layer 10 extends along the passivation oxide film 13. The passivation oxide film 13 between the gate electrode 8 and the second insulating layer 10 reduces gate-overlap capacitance. Reduced gate-overlap capacitance stabilizes the voltage-current characteristic of the vertical MOS transistor 22, thereby improving the reliability of the vertical MOS transistor 22.

Process for Forming Second Diffusion Region:

With reference gain to FIGS. 4K and 3, a wet etching process is carried out to remove the silicon nitride mask layer 50, so that the top surface of the silicon oxide film 2 is exposed, and a hollowed portion is formed over the silicon oxide film 2.

A dopant is introduced into the second side portion 3b of the pillar 3 through the silicon oxide film 2, thereby forming a second diffusion region 5 in the second side portion 3b of the pillar 3. The introduction of a dopant can be carried out by, but is not limited to, an ion-implantation process. In some cases, the ion-implantation process can be carried out at acceleration energy of 10 keV and a dose of 1E15 $cm^{-2}$.

The bottom of the second diffusion region 5 is bounded with the top of the pillar 3. The pillar 3 has a body 35 which is illustrated in FIG. 3. The body 35 of the pillar 3 is vertically interposed between the first and second diffusion regions 4 and 5. The body 35 of the pillar 3 is positioned in level below the second diffusion region 5 and above the first diffusion region 4. The bottom portion of the second diffusion region 5 is just or nearly equal in level to or higher in level than the top portion of the gate electrode 8. The gate electrode 8 does not horizontally overlap the first diffusion region 4. The gate electrode 8 does not horizontally surround the second diffusion region 5. The gate electrode 8 horizontally overlaps the body 35 of the pillar 3. The gate electrode 8 horizontally surrounds the body 35 of the pillar 3.

Consequently, the gate electrode 8 may horizontally overlap, at least at part of the body 35, but typically may overlap all of the body 35 without horizontally overlapping the first and second diffusion regions 4 and 5. In some cases, the top portion of the gate electrode 8 may have the same level as or a lower level than the bottom of the second diffusion region 5. The bottom portion of the gate electrode 8 may be just or nearly equal in level to or higher in level than the top of the first diffusion region 4.

An inter-layer insulator 11 is formed over the second diffusion region 5, the gate insulating film 7 and the second insulating layer 10. The inter-layer insulator 11 covers the pillar 3 and the semiconductor substrate 1. In some cases, the inter-layer insulator 11 can be implemented by, but is not limited to, an oxide film. Typically, the thickness of the inter-layer insulator 11 can be, but is not limited to, 300 nm.

A resist film is applied on the inter-layer insulator 11. A lithography process is carried out to pattern the resist film, thereby forming a resist pattern on the inter-layer insulator 11. A dry etching process is carried out using the resist pattern as a mask to selectively etch the inter-layer insulator 11, thereby forming a contact hole which reaches the second diffusion region 5. A contact plug 12 is then formed in the contact hole in the inter-layer insulator 11, wherein the contact plug 12 is electrically connected to the second diffusion region 5. Optionally, but not essentially, an additional planarization process can be carried out to improve the planarity of the inter-layer insulator 11. In some oases, the additional planarization process can be implemented by, but is not limited to, a chemical mechanical polishing process.

In accordance with the above described second preferred embodiment, the passivation oxide film 13 thus extends along the upper portion of the gate insulating film 7 and the top and side surface of the gate electrode 8. The additional passivation oxide film 13 extends along the outside surface 8c of the gate electrode 8, the top portion 8b of the gate electrode 8 and the upper portion 7b of the gate insulating film 7. The second insulating layer 10 extends along the passivation oxide film 13. The passivation oxide film 13 between the gate electrode 8 and the second insulating layer 10 reduces gate-overlap capacitance. Reduced gate-overlap capacitance stabilizes the voltage-current characteristic of the vertical MOS transistor 22, thereby improving the reliability of the vertical MOS transistor 22.

The upper portion of the gate insulating film 7 remains covered by the thinner portion of the gate electrode layer 80. The thinner portion of the gate electrode layer 80 can prevent the gate insulating film 7 from being damaged by the anisotropic etching process, thereby improving the gate breakdown voltage characteristics.

Similarly to the first preferred embodiment, the gate electrode 8 does not horizontally overlap the first diffusion region 4. The gate electrode 8 does not horizontally surround the first diffusion region 4. The gate electrode 8 horizontally overlaps the pillar 3, except for its upper region. The gate electrode 8 horizontally surrounds the pillar 3, except for its upper region.

Further, the second diffusion region 5 is so formed that the bottom portion of the second diffusion region 5 is the same or lower in level than the top portion of the gate electrode 8. The gate electrode 8 does not horizontally overlap the first diffusion region 4. The gate electrode 8 does not horizontally surround the second diffusion region 5. The gate electrode 8 horizontally overlaps the body 35 of the pillar 3. The gate electrode 8 horizontally surrounds the body 35 of the pillar 3.

Consequently, the gate electrode 8 may horizontally overlap, at least at part of the body 35, but typically may overlap all of the body 35 without horizontally overlapping the first and second diffusion regions 4 and 5. In some cases, the top portion of the gate electrode 8 may have the same level as or a lower level than the bottom of the second diffusion region 5. The bottom portion of the gate electrode 8 may be just or nearly equal in level to or higher in level tan the top of the first diffusion region 4. Reduced gate-overlap capacitance stabilizes the voltage-current characteristic of the vertical MOS transistor 21, thereby improving the reliability of the vertical MOS transistor 21.

In briefly, the method of the semiconductor device may include the following processes. After the first diffusion region is formed, an oxidation process is carried out to oxidize surface regions of the side surface of the pillar and the semiconductor substrate, thereby forming a dummy oxide film along the side surface of the pillar and the surface of the semiconductor substrate. The dummy oxide film is then removed so as to narrow the pillar, whereby the side surface of the pillar becomes positioned more inside than the side edge of the first hard mask, before the first insulating layer is formed on the side surface of the pillar. The gate insulating film is formed on the side surface of the pillar so that the gate insulating film is positioned inside more than the side edge of the first hard mask. The second anisotropic etching process is carried out by anisotropically etching the conductive layer so that the conductive layer has thinner and thicker portions and an upward face between the thinner and thicker portions. The thinner portion is positioned directly under the side edge of the first hard mask. The thicker portion has an outside face that is positioned more outside than the side edge of the hard mask. A surface region of the conductive layer is oxidized, thereby making the thinner portion and a surface region of the thicker portion into an oxide film, while forming the gate electrode that is an unoxidized portion of the conductive film.

Third Embodiment

Figure 5:
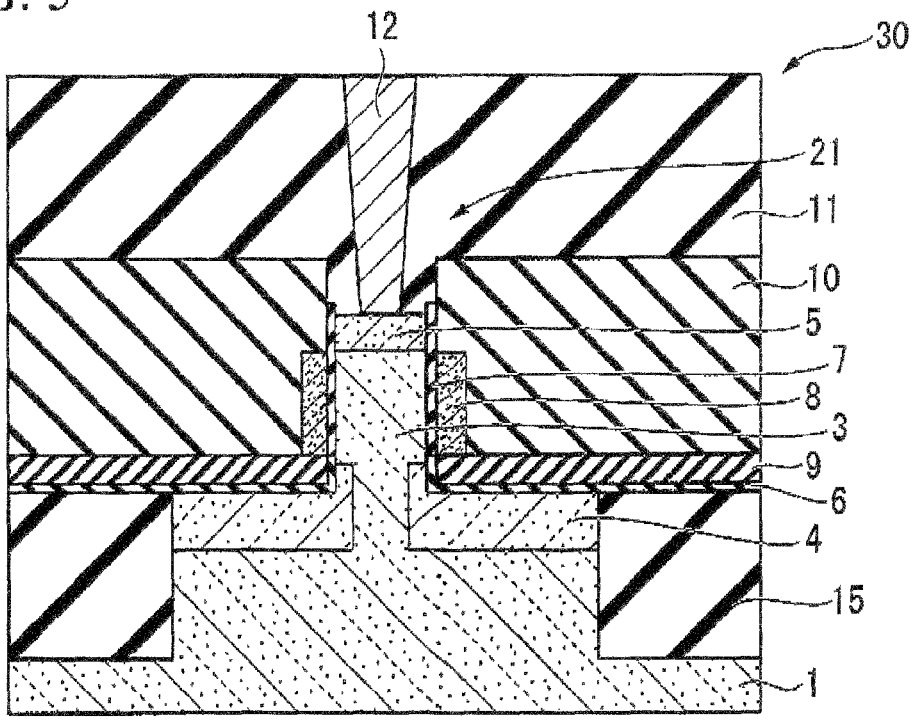
FIG. 5 is a fragmentary cross sectional elevation view illustrating a semiconductor device in accordance with an example of a third preferred embodiment of the present invention.

A semiconductor device 30 will be described in accordance with an example of a third preferred embodiment of the present invention. With reference to FIG. 5, the semiconductor device 30 may includes, but is not limited to, the semiconductor substrate 1, an isolation region 15 and an active region in which the above-described vertical MOS transistor 21 shown in FIG. 1 is provided. The isolation region 15 surrounds the above-described vertical MOS transistor 21. The isolation region 15 can be formed in the semiconductor substrate 1 in the known technique before the above-described vertical MOS transistor 21 is then formed in the processes described above with reference to FIGS. 2A through 2P.

Similarly to the first embodiment, the gate electrode 8 horizontally overlaps the body 35 without horizontally overlapping the first and second diffusion regions 4 and 5. Reduced gate-overlap capacitance stabilizes the voltage-current characteristic of the semiconductor device 30 including the vertical MOS transistor 21, thereby improving the reliability of the v semiconductor device 30.

Figure 6:
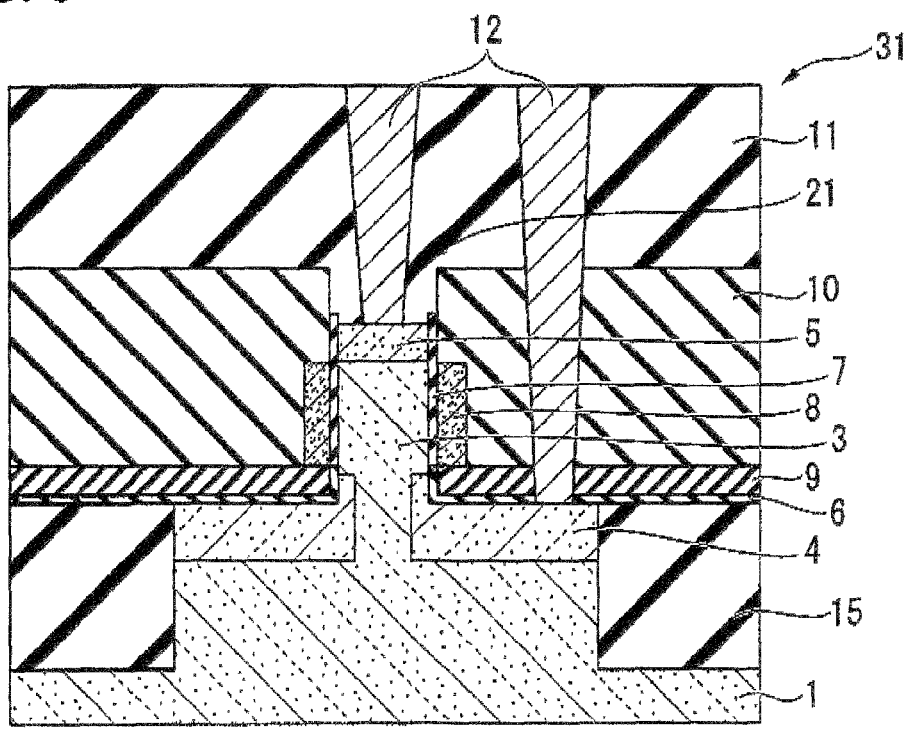
FIG. 6 is a fragmentary cross sectional elevation view illustrating a semiconductor device in accordance with another example of the third preferred embodiment of the present invention.

A semiconductor device 31 will be described in accordance with another example of the third preferred embodiment of the present invention. With reference to FIG. 6, the semiconductor device 31 may includes, but is not limited to, the semiconductor substrate 1, an isolation region 15 and an active region in which the above-described vertical MOS transistor 21 shown in FIG. 1 is provided. The isolation region 15 surrounds the above-described vertical MOS transistor 21. The isolation region 15 can be formed in the semiconductor substrate 1 in the known technique before the above-described vertical MOS transistor 21 is then formed in the processes described above with reference to FIGS. 2A through 2P. The semiconductor device 31 includes the contact plugs 12, one of which reaches the second diffusion region 5, and the other contact plug 12 reaches the first diffusion region 4. The contact plugs 12 can be formed in the known technique after the above-described vertical MOS transistor 21 has been formed.

Similarly to the first embodiment, the gate electrode 8 horizontally overlaps the body 35 without horizontally overlapping the first and second diffusion regions 4 and 5. Reduced gate-overlap capacitance stabilizes the voltage-current characteristic of the semiconductor device 31 including the vertical MOS transistor 21, thereby improving the reliability of the v semiconductor device 31.

Fourth Embodiment

Figure 7A:
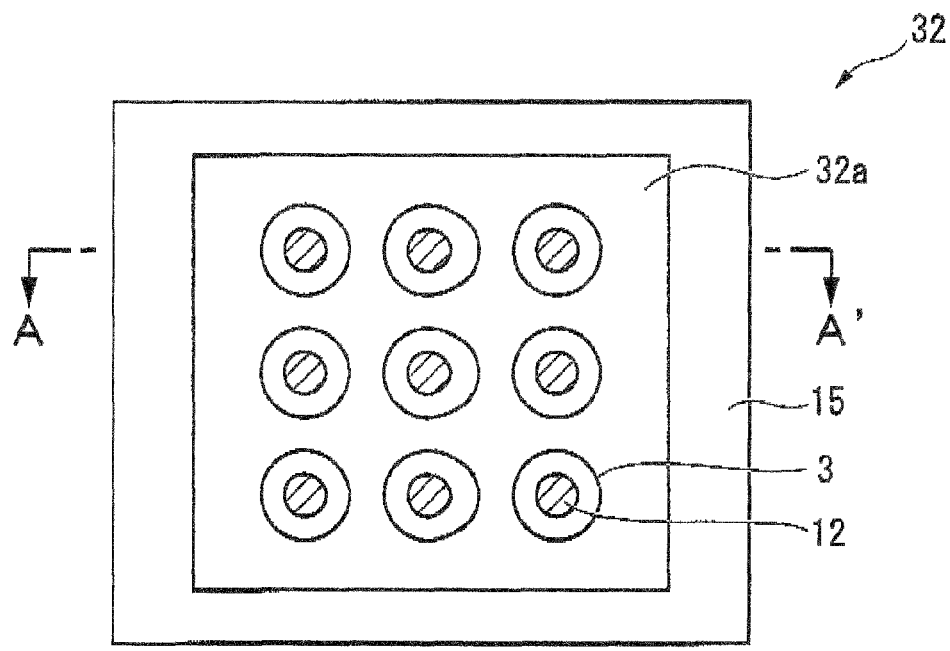
FIG. 7A is a fragmentary plan view illustrating a semiconductor device in accordance with an example of a fourth preferred embodiment of the present invention.
Figure 7B:
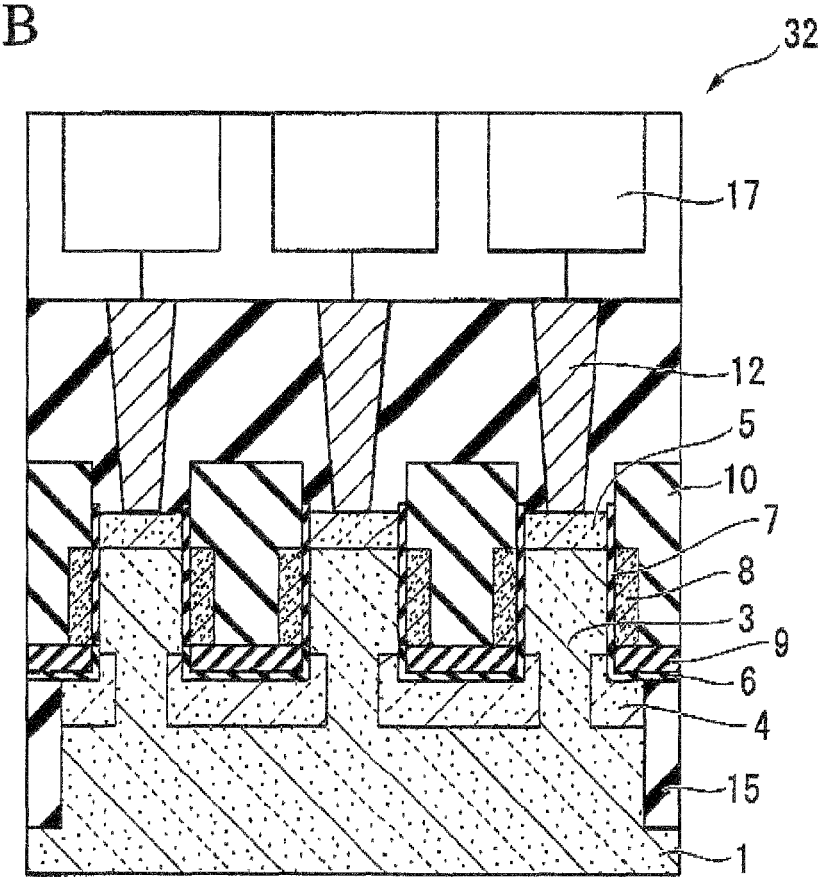
FIG. 7B is a fragmentary cross sectional elevation view, taken along an A-A' line of FIG. 7A, illustrating the semiconductor device of FIG. 7A.

A semiconductor device 32 will be described in accordance with an example of a fourth preferred embodiment of the present invention. With reference to FIGS. 7A and 7B, the semiconductor device 32 may perform as a DRAM having an array of memory cells. The semiconductor device 32 has an active region 32a and an isolation region 15 which surrounds the active region 32a. The active region 32a includes the array of memory cells. The array of memory cells may be, but is not limited to, a 3×3 matrix array of memory cells. The matrix array of memory cells has a matrix array of pillars 3 with contact plugs 12. The pillars 3 may each have a generally cylindrical shape as shown in FIGS. 7A and 7B. The contact plugs 12 may each have a generally cylindrical shape as shown in FIGS. 7A and 7B.

As shown in FIG. 7B, each memory cell has the semiconductor device 21 that has been described with reference to FIG. 1. Namely, each active region 32a may have the array of the semiconductor devices 21. As described above, the semiconductor device 21 is designed to reduce the gate-overlap capacitance. Reduced gate-overlap capacitance stabilizes the voltage-current characteristic of the semiconductor device 32, thereby improving the reliability of the semiconductor device 32.

As shown in FIG. 7B, each of the semiconductor devices 21 may be connected through the contact plug 12 to an additional element 17, thereby realizing the memory cell by the semiconductor device 21 with the additional element. Typical examples of the additional element 17 may include, but are not limited to, capacitors or phase change material.

Figure 8:
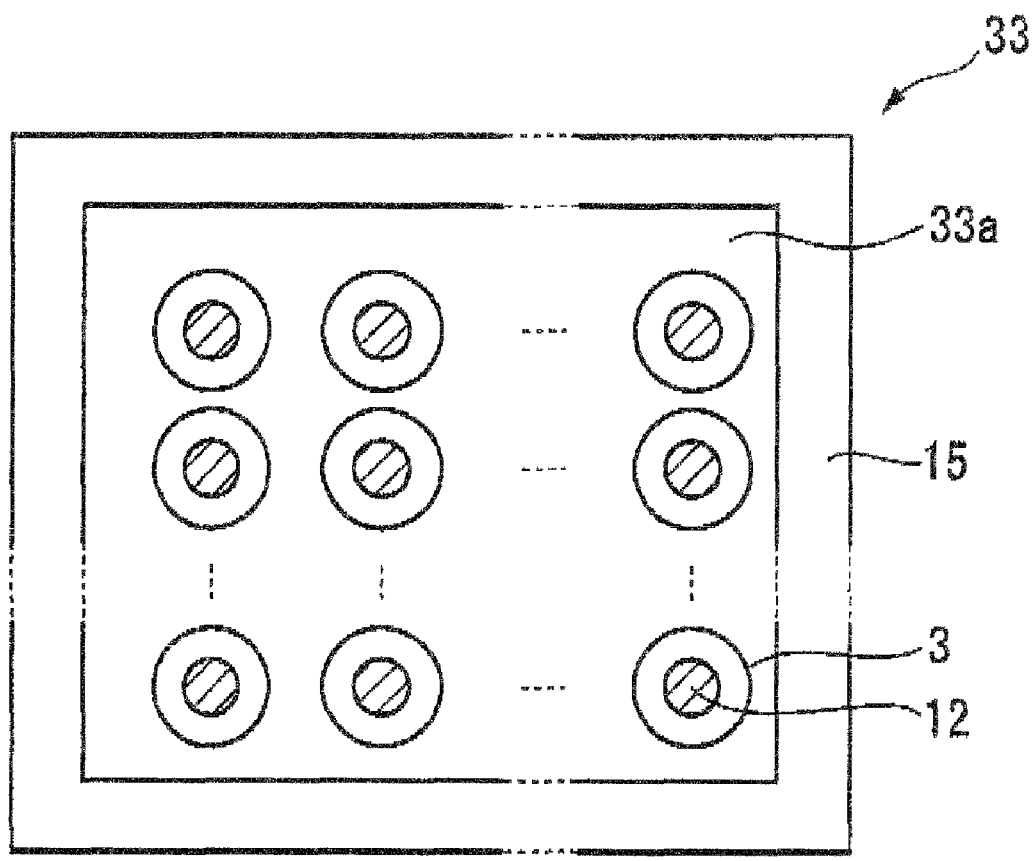
FIG. 8 is a fragmentary plan view illustrating a semiconductor device in accordance with another example of the fourth preferred embodiment of the present invention.

A semiconductor device 33 will be described in accordance with another example of the third preferred embodiment of the present invention. With reference to FIG. 8, the semiconductor device 33 may perform as a DRAM having an array of more memory cells. The semiconductor device 33 has an active region 33a and an isolation region 15 which surrounds the active region 33a. The active region 33a includes the array of memory cells. The array of memory cells may be, but is not limited to, a matrix array of memory cells. The matrix array of memory cells has a matrix array of pillars 3 with contact plugs 12. The pillars 3 may each have a generally cylindrical shape. The contact plugs 12 may each have a generally cylindrical shape.

As shown in FIG. 8, each memory cell has increased number of the semiconductor devices 21, each of which has been described with reference to FIG. 1. Namely, each active region 33a may have the array of the semiconductor devices 21. As described above, the semiconductor device 21 is designed to reduce the gate-overlap capacitance. Reduced gate-overlap capacitance stabilizes the voltage-current characteristic of the semiconductor device 33, thereby improving the reliability of the semiconductor device 33.

The semiconductor devices 21 and 22 may typically perform, but not limited to, a vertical MOS transistor. The semiconductor devices 21 and 22 may be suitable for farther high density integration and further shrinkage, while ensuring high performance and high reliability. The semiconductor memory devices 32 and 33 that may include the semiconductor device 21 or 22 may also be suitable for further high density integration and fisher shrinkage, while ensuring high performance and high reliability.

As used herein, the term "pillar" may include any types of a portion of semiconductor which generally extends in a direction vertical to the surface of a semiconductor substrate, but is not limited to the pillar shape as defined in mathematics, so that the semiconductor device may include a channel region which at least partially extends generally in the vertical direction.

The following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," "nearly" and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device, comprising:
   a semiconductor substrate;
   a vertically extending portion of semiconductor disposed above the semiconductor substrate, the vertically extending portion of semiconductor having top and bottom portions and a side surface;
   a first diffusion region disposed near the bottom portion of the vertically extending portion of semiconductor and positioned in the semiconductor substrate, the first diffusion region including a first diffusion portion extending along a horizontal direction along a surface of the semiconductor substrate and a second diffusion portion extending from the first diffusion portion along a vertical direction along the side surface of the vertically extending portion of semiconductor;
   a second diffusion region disposed near the top portion of the vertically extending portion of semiconductor;
   a gate insulating film extending along the side surface of the vertically extending portion of semiconductor;
   a gate electrode disposed on the gate insulating film, the gate electrode opposed to the side surface, the level of a top portion of the gate electrode being nearly equal to or lower than the level of a bottom portion of the second diffusion region, and the level of a bottom portion of the gate electrode being nearly equal to or higher than the level of a top portion of the first diffusion region; and
   an insulating layer positioned under the gate electrode and over the surface of the semiconductor substrate,
   wherein the second diffusion portion of the first diffusion layer has an upper surface that is at a lower level than a top surface of the insulating layer and is at a higher level than a bottom surface of the insulating layer.

2. The semiconductor device according to claim 1, wherein the vertically extending portion of semiconductor comprises a pillar that extends from the surface of the semiconductor substrate in the vertical direction to the surface of the semiconductor substrate.

3. The semiconductor device according to claim 2, wherein the first diffusion region is provided around a bottom portion of the pillar in the semiconductor substrate.

4. The semiconductor device according to claim 2, wherein the second diffusion region is provided over a top portion of the pillar.

5. The semiconductor device according to claim 1, wherein the gate electrode surrounds the vertically extending portion of semiconductor along the horizontal direction.

6. The semiconductor device according to claim 1, further comprising:
a first insulating layer that covers and surrounds the first diffusion region along the horizontal direction; and
a second insulating layer that surrounds the first diffusion region along the horizontal direction.

7. The semiconductor device according to claim 6, wherein the gate insulating film surrounds the second diffusion region along the horizontal direction, and the second insulating layer further surrounds the gate electrode along the horizontal direction.

8. The semiconductor device according to claim 7, further comprising:
a passivation film which covers the gate insulating film and the gate electrode, the passivation film separating the second insulating layer from the gate insulating film and the gate electrode.

9. A semiconductor device, comprising:
a semiconductor substrate;
a vertically extending portion of semiconductor disposed above the semiconductor substrate, the vertically extending portion of semiconductor having top and bottom portions and a side surface;
a first diffusion region disposed near the bottom portion of the vertically extending portion of semiconductor;
a second diffusion region disposed near the top portion of the vertically extending portion of semiconductor;
a gate insulating film extending along the side surface of the vertically extending portion of semiconductor;
a gate electrode disposed on the gate insulating film, the gate electrode being separated by the gate insulating film from the vertically extending portion of semiconductor, the gate electrode horizontally overlapping at least a part of the vertically extending portion of semiconductor without horizontally overlapping the first and second diffusion regions; and
an insulating layer having first and second portions positioned under the gate electrode and over a surface of the semiconductor substrate.

10. The semiconductor device according to claim 9, wherein the vertically extending portion of semiconductor comprises a pillar that extends from the surface of the semiconductor substrate in a vertical direction to the surface of the semiconductor substrate.

11. The semiconductor device according to claim 10, wherein the first diffusion region is provided in the semiconductor substrate and around a bottom portion of the pillar.

12. The semiconductor device according to claim 10, wherein the second diffusion region is provided over a top portion of the pillar.

13. The semiconductor device according to claim 9, wherein the gate electrode horizontally surrounds the vertically extending portion of semiconductor.

14. The semiconductor device according to claim 9, further comprising:
a first insulating layer that covers and horizontally surrounds the first diffusion region; and
a second insulating layer that horizontally surrounds the first diffusion region.

15. The semiconductor device according to claim 14, wherein the gate insulating film horizontally surrounds the second diffusion region, and the second insulating layer further horizontally surrounds the gate electrode.

16. The semiconductor device according to claim 15, further comprising:
a passivation film which covers the gate insulating film and the gate electrode, the passivation film separating the second insulating layer from the gate insulating film and the gate electrode.

17. A semiconductor device, comprising:
a semiconductor substrate;
a pillar of semiconductor that extends from the semiconductor substrate generally in a vertical direction to a surface of the semiconductor substrate, the pillar of semiconductor having top and bottom portions and a side surface;
a first diffusion region disposed around the bottom portion of the pillar of semiconductor and positioned in the semiconductor substrate, the first diffusion region including a first diffusion portion extending along a horizontal direction along a surface of the semiconductor substrate and a second diffusion portion extending from the first diffusion portion along a vertical direction along the side surface of the vertically extending portion of semiconductor;
a second diffusion region disposed over the top portion of the pillar of semiconductor;
a gate insulating film extending along the side surface of the pillar of semiconductor;
a gate electrode disposed on the gate insulating film, the gate electrode being separated by the gate insulating film from the pillar of semiconductor, the gate electrode horizontally overlapping at least a part of the pillar of semiconductor without horizontally overlapping the first and second diffusion regions; and
an insulating layer having first and second portions positioned under the gate electrode and over the surface of the semiconductor substrate,
wherein the second diffusion portion of the first diffusion layer has an upper surface that is at a lower level than a top surface of the insulating layer and is at a higher level than a bottom surface of the insulating layer.

18. The semiconductor device according to claim 17, further comprising:
a first insulating layer that covers and surrounds the first diffusion region along the horizontal direction; and
a second insulating layer that surrounds the first diffusion region along the horizontal direction.

19. The semiconductor device according to claim 18, wherein the gate insulating film surrounds the second diffusion region along the horizontal direction, and the second insulating layer further surrounds the gate electrode along the horizontal direction.

20. The semiconductor device according to claim 19, further comprising:
a passivation film which covers the gate insulating film and the gate electrode, the passivation film separating the second insulating layer from the gate insulating film and the gate electrode.

* * * * *